(12) United States Patent
Hatano et al.

(10) Patent No.: US 9,601,547 B2
(45) Date of Patent: Mar. 21, 2017

(54) SOLID-STATE IMAGE PICKUP DEVICE AND ELECTRONIC APPARATUS

(71) Applicant: SONY CORPORATION, Tokyo (JP)

(72) Inventors: Keisuke Hatano, Kanagawa (JP); Atsushi Toda, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/420,002

(22) PCT Filed: Aug. 7, 2013

(86) PCT No.: PCT/JP2013/071338
§ 371 (c)(1),
(2) Date: Feb. 6, 2015

(87) PCT Pub. No.: WO2014/027588
PCT Pub. Date: Feb. 20, 2014

(65) Prior Publication Data
US 2015/0187843 A1    Jul. 2, 2015

(30) Foreign Application Priority Data
Aug. 14, 2012    (JP) ................. 2012-179688

(51) Int. Cl.
| | | |
|---|---|---|
| H01L 27/30 | (2006.01) | |
| H01L 27/146 | (2006.01) | |
| H04N 9/07 | (2006.01) | |
| H01L 51/44 | (2006.01) | |

(52) U.S. Cl.
CPC ........ *H01L 27/307* (2013.01); *H01L 27/1464* (2013.01); *H01L 51/441* (2013.01); *H04N 9/07* (2013.01)

(58) Field of Classification Search
CPC . H01L 27/307; H01L 27/1464; H01L 51/441; H04N 9/07
See application file for complete search history.

(56) References Cited

U.S. PATENT DOCUMENTS

| | | | |
|---|---|---|---|
| 2011/0032376 A1* | 2/2011 | Takizawa .......... | H01L 27/14627 348/222.1 |
| 2011/0156104 A1* | 6/2011 | Yamaguchi ....... | H01L 27/14603 257/222 |
| 2012/0153418 A1* | 6/2012 | Nakadate .......... | H01L 27/14605 257/432 |

FOREIGN PATENT DOCUMENTS

| | | |
|---|---|---|
| JP | 2010-067828 A | 3/2010 |
| JP | 2010-129548 A | 6/2010 |
| JP | 2011-029337 | 2/2011 |
| JP | 2012-084873 A | 4/2012 |
| WO | WO2008/010292 A1 | 1/2008 |

OTHER PUBLICATIONS

International Search Report prepared by the Japanese Patent Office on Nov. 5, 2013, for International Application No. PCT/JP2013/071338.

* cited by examiner

*Primary Examiner* — John P Dulka
*Assistant Examiner* — Charles R Peters
(74) *Attorney, Agent, or Firm* — Chip Law Group

(57) ABSTRACT

A solid-state image pickup device includes at least two stacked first and second photoelectric conversion sections in each of a plurality of pixels. Sensitivity of the first photoelectric conversion section to a light incident angle is equivalent to sensitivity of the second photoelectric conversion section to a light incident angle, for each of the pixels.

16 Claims, 23 Drawing Sheets

LIGHT INCIDENT ANGLE

LIGHT INCIDENT ANGLE

FIG. 22

| A | B | A | B | A | B | A | B |
|---|---|---|---|---|---|---|---|
| B | A | B | A | B | A | B | A |
| A | B | A | B | A | B | A | B |
| B | A | B | A | B | A | B | A |
| A | B | A | B | A | B | A | B |
| B | A | B | A | B | A | B | A |
| A | B | A | B | A | B | A | B |
| B | A | B | A | B | A | B | A |

LIGHT INCIDNET ANGLE

LIGHT INCIDENT ANGLE

LIGHT INCIDENT ANGLE

LIGHT INCIDENT ANGLE

SOLID-STATE IMAGE PICKUP DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2013/071338 having an international filing date of Aug. 7, 2013, which designated the United States, which PCT application claimed the benefit of Japanese Patent Application No. 2012-179688 filed Aug. 14, 2012, the disclosures of both the above-identified applications are incorporated herein by reference.

TECHNICAL FIELD

The present disclosure relates to a solid-state image pickup device and an electronic apparatus each including a photoelectric conversion element as a pixel.

BACKGROUND ART

As a solid-state image pickup device such as a charge coupled device (CCD) image sensor and a complementary metal oxide semiconductor (CMOS) image sensor, a solid-state image pickup device in which photoelectric conversion layers of a plurality of colors (for example, R, G, and B) are stacked in one pixel to obtain signals of three colors from one pixel has been proposed (for example, PTL1). In the solid-state image pickup device in the PTL1, for example, an organic photoelectric conversion section that detects green light and generates signal charges corresponding to the green light is provided on a silicon substrate, and a photodiode (an inorganic photoelectric conversion section) detecting red light and blue light is provided in the silicon substrate.

CITATION LIST

Patent Literature

PTL 1: Japanese Unexamined Patent Application Publication No. 2011-29337

SUMMARY OF INVENTION

In the solid-state image pickup device having the stacked photoelectric conversion layers of the respective colors as described above, the color reproducibility is desired to be improved without using signal processing and the like.

Therefore, it is desirable to provide a solid-state image pickup device and an electronic apparatus that are capable of improving color reproducibility irrespective of signal processing.

A solid-state image pickup device according to an embodiment of the disclosure includes a plurality of pixels each having at least two stacked first and second photoelectric conversion sections, and change rates of sensitivity of the respective first and second photoelectric conversion sections to a light incident angle are equal to each other for each of the pixels.

An electronic apparatus according to an embodiment of the disclosure includes the solid-state image pickup device according to the above-described embodiment of the disclosure.

In the solid-state image pickup device and the electronic apparatus according to the respective embodiments of the disclosure, the change rates of sensitivity (the change rates of the sensitivity when the light incident angle is changed) of the respective stacked first and second photoelectric conversion sections to the light incident angle are equal to each other for each of the pixels, and therefore, the ratio of the pixel output obtained from each of the photoelectric conversion section becomes constant irrespective of the light incident angle.

According to the solid-state image pickup device and the electronic apparatus of the respective embodiments of the disclosure, the change rates of sensitivity of the respective stacked first and second photoelectric conversion sections to the light incident angle are equal to each other for each of the pixels. Therefore, it is possible to suppress variation of the ratio of the pixel output obtained from each of the photoelectric conversion sections. Consequently, it is possible to improve the color reproducibility irrespective of the signal processing.

BRIEF DESCRIPTION OF DRAWINGS

FIG. 22 is a schematic diagram illustrating a layout example of the pixels illustrated in FIG. 21A and FIG. 21B.

DESCRIPTION OF EMBODIMENTS

Hereinafter, some embodiments of the disclosure will be described in detail with reference to drawings. Note that description will be given in the following order.

1. First embodiment (an example of a photoelectric conversion element including an organic photoelectric conversion section (G) on a semiconductor substrate and an inorganic photoelectric conversion section (B and R) in the semiconductor substrate)

2. Second embodiment (an example in a case where an upper electrode is separated for each pixel)

3. Third embodiment (an example in a case where an organic photoelectric conversion section (G and B) and an inorganic photoelectric conversion section (R) are stacked)

4. Fourth embodiment (an example in a case where only an organic photoelectric conversion section (R, G, and B) is stacked)

5. Fifth embodiment (an example in a case where pixels with different light receiving wavelengths are arranged in parallel)

6. Sixth embodiment (an example in a case where pupil correction by an on-chip lens is added)

7. Overall configuration example of solid-state image pickup device

8. Application example (an example of an electronic apparatus (a camera))

First Embodiment

Structure

Figure 1:
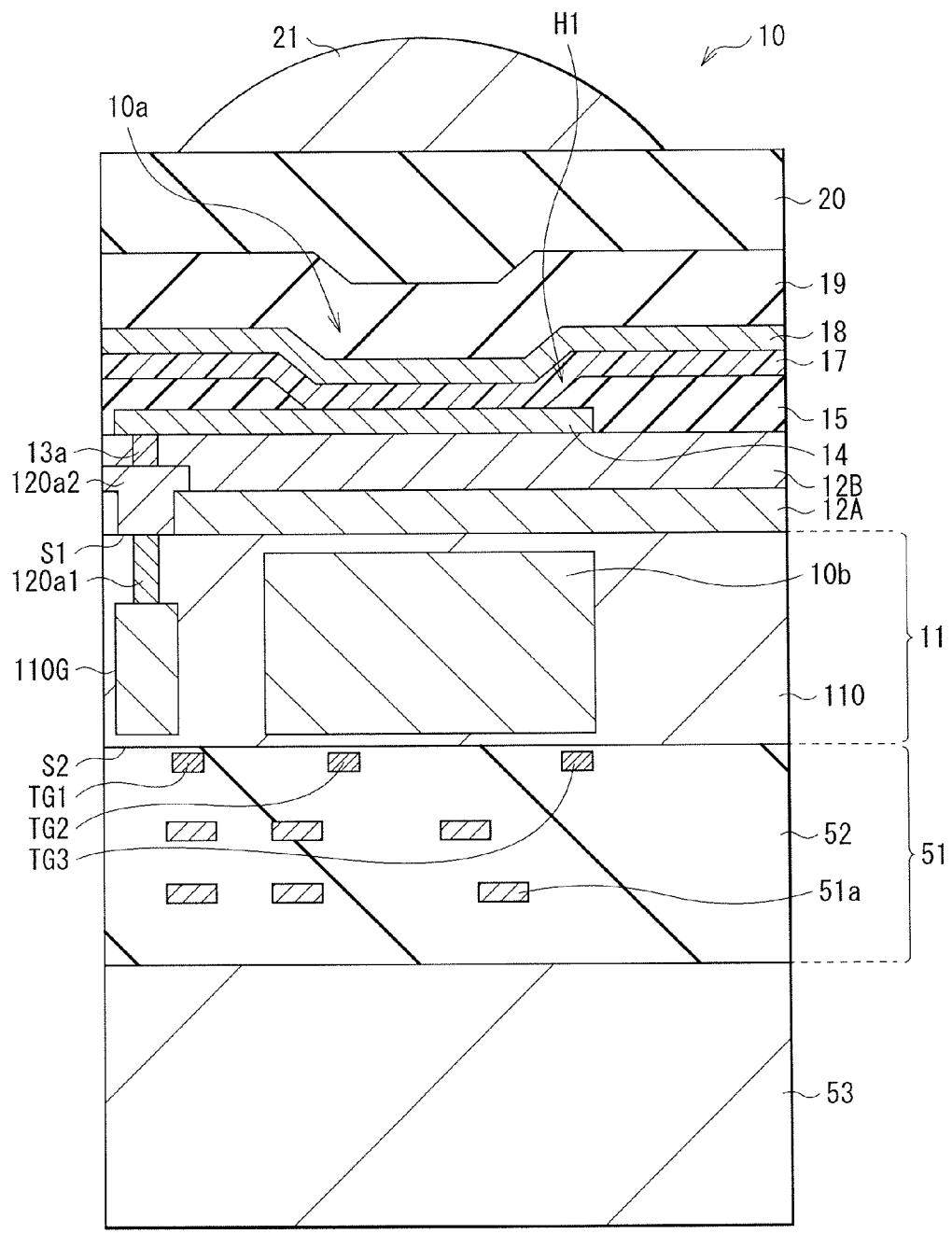
FIG. 1 is a sectional diagram illustrating a schematic structure example of a photoelectric conversion element (a pixel) according to a first embodiment of the disclosure.

FIG. 1 illustrates a schematic sectional structure of a pixel (a photoelectric conversion element 10) in a solid-state image pickup device according to a first embodiment of the disclosure. Although the detail will be described later, the solid-state image pickup device may be, for example, a charge coupled device (CCD) image sensor, a complementary metal oxide semiconductor (CMOS) image sensor, or the like. In the photoelectric conversion element 10, pixel transistors (including transfer transistors Tr1 to Tr3 described later) are formed on a front surface (a surface S2 on a side opposite to a light receiving surface) side of a semiconductor substrate 11 and a multilayer wiring layer (a multilayer wiring layer 51) is provided on the surface S2 side.

For example, the photoelectric conversion element 10 may have a structure in which an organic photoelectric conversion section 10a (a first photoelectric conversion section) and an inorganic photoelectric conversion section 10b (a second photoelectric conversion section) that selectively detect light of wavelengths different from each other to perform photoelectric conversion are stacked in a vertical direction. The organic photoelectric conversion section 10a is formed on the semiconductor substrate 11 and includes an organic photoelectric conversion layer (an organic photoelectric conversion layer 17). The inorganic photoelectric conversion section 10b is formed in the semiconductor substrate 11. Accordingly, in the solid-state image pickup device described later, it is possible to obtain a plurality of kinds of color signals by one pixel without using a color filter.

Figure 2:
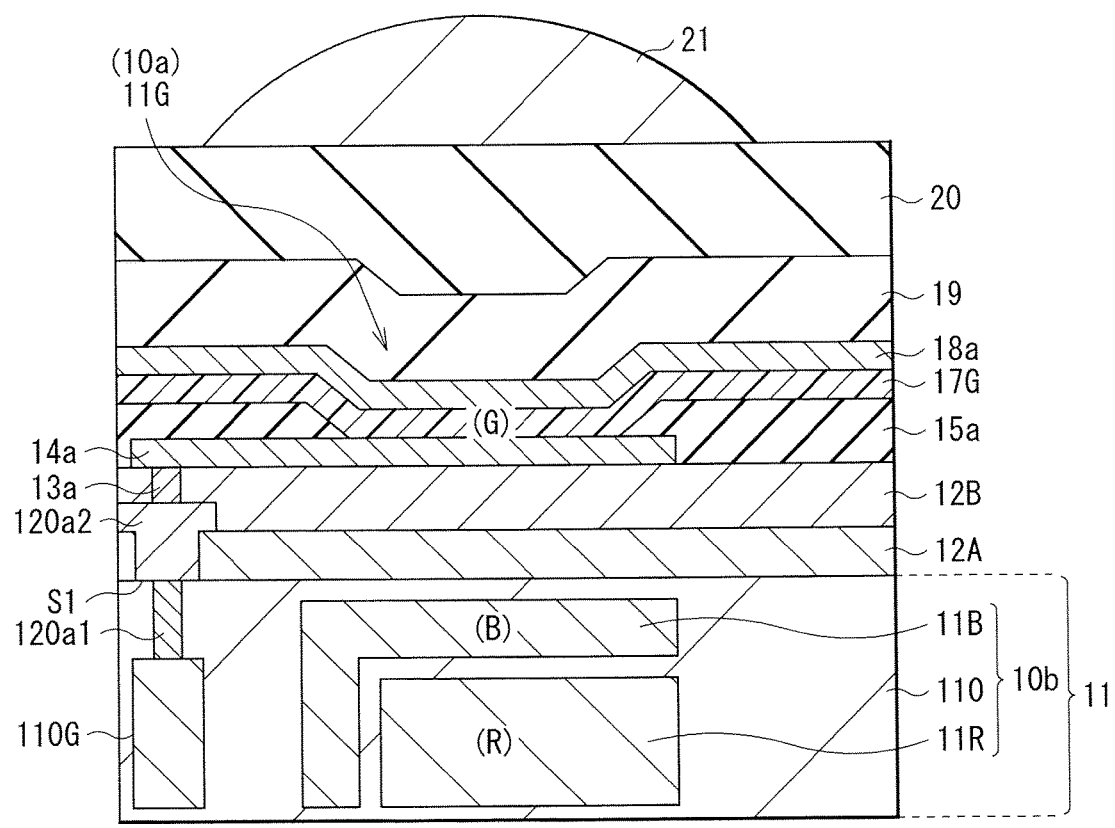
FIG. 2 is a sectional diagram illustrating a structure of a main part of the photoelectric conversion element according to the first embodiment of the disclosure.

In the present embodiment, as illustrated in FIG. 2, the photoelectric conversion element 10 has a stacked structure configured of one organic photoelectric conversion section 11G and two inorganic photoelectric conversion layers 11B and 11R, and accordingly acquires color signals of red (R), green (G), and blue (B). The organic photoelectric conversion section 11G may include, for example, an organic photoelectric conversion layer 17G that detects green light (performs photoelectric conversion of green light), and the inorganic photoelectric conversion section 10b may include, for example, an inorganic photoelectric conversion layer 11B that detects blue light and an inorganic photoelectric conversion layer 11R that detects red light.

(Semiconductor Substrate 11)

For example, the semiconductor substrate 11 may include the inorganic photoelectric conversion layers 11B and 11R and a green storage layer 110G that are embedded in a predetermined region of an n-type silicon (Si) layer 110. In the semiconductor substrate 11, a conductive plug 120a1 that is a transmission path of charges (electrons or holes)

from the organic photoelectric conversion section 11G is also embedded. In the present embodiment, a back surface (a surface S1) of the semiconductor substrate 11 is a light receiving surface. On the front surface (the surface S2) side of the semiconductor substrate 11, a plurality of pixel transistors (including transfer transistors Tr1 to Tr3) each corresponding to the organic photoelectric conversion section 11G and the inorganic photoelectric conversion layers 11B and 11R are formed, and a peripheral circuit configured of a logic circuit and the like is formed.

Examples of the pixel transistor may include, for example, a transfer transistor, a reset transistor, an amplification transistor, and a selection transistor. Each of these pixel transistors may be configured of, for example, an MOS transistor, and is formed on a p-type semiconductor well region on the surface S2 side. A circuit including such a pixel transistor is formed for each of red, green, and blue photoelectric conversion sections. Each circuit may have a three-transistor configuration including a total of three transistors, for example, the transfer transistor, the reset transistor, and the amplification transistor out of these pixel transistors, or may have a four-transistor configuration added with the selection transistor. Here, out of these pixel transistors, only the transfer transistors Tr1 to Tr3 are illustrated. Incidentally, pixel transistors other than the transfer transistors may be shared between the photoelectric conversion sections or between the pixels. Moreover, so-called pixel share configuration in which floating diffusion is shared may be applied.

Each of the transfer transistors Tr1 to Tr3 is configured to include a gate electrode (gate electrodes TG1 to TG3) and a floating diffusion (FDs 113, 114, and 116). The transfer transistor Tr1 transfers signal charges (electrons in the present embodiment) corresponding to green that are generated in the organic photoelectric conversion section 11G and are accumulated in the green storage layer 110G, to a vertical signal line Lsig described later. The transfer transistor Tr2 transfers signal charges (electrons in the present embodiment) corresponding to blue that are generated and accumulated in the inorganic photoelectric conversion layer 11B, to the vertical signal line Lsig described later. Likewise, the transfer transistor Tr3 transfers signal charges (electrons in the present embodiment) corresponding to red that are generated and accumulated in the inorganic photoelectric conversion layer 11R, to the vertical signal line Lsig described later.

The inorganic photoelectric conversion layers 11B and 11R are each a photo diode having a pn junction, and for example, may be formed in order of the inorganic photoelectric conversion layers 11B and 11R from the surface S1 side (the light incident side) in the semiconductor substrate 11. Among them, the inorganic photoelectric conversion layer 11B selectively detect blue light and allows the signal charges corresponding to blue to be accumulated, and for example, may be formed to extend from a selective region along the surface S1 of the semiconductor substrate 11 to a region in the vicinity of an interface with the multilayer wiring layer 51. The inorganic photoelectric conversion layer 11R selectively detects red light and allows the signal charges corresponding to red to be accumulated, and for example, may be formed in a region in a lower layer (on the surface S2 side) than the inorganic photoelectric conversion layer 11B. Note that blue (B) may be a color corresponding to a wavelength range of 450 nm to 495 nm both inclusive, red (R) may be a color corresponding to a wavelength range of 620 nm to 750 nm both inclusive, and it is sufficient for the inorganic photoelectric conversion layers 11B and 11R to each be capable of detecting light of a part or all of the above-described corresponding wavelength range.

Figure 3A:
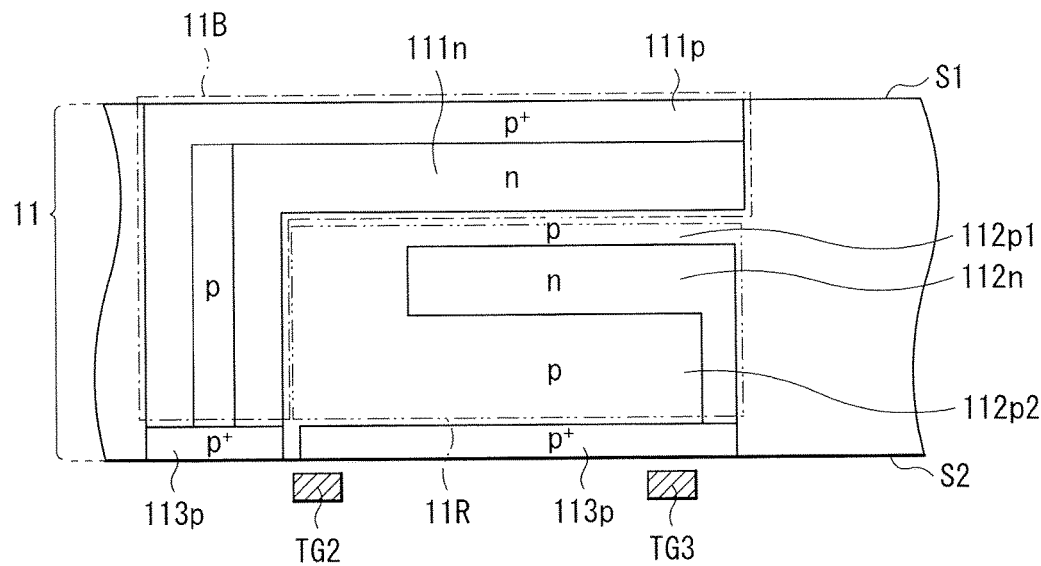
FIG. 3A is a sectional diagram illustrating a structure example of an inorganic photoelectric conversion section.
Figure 3B:
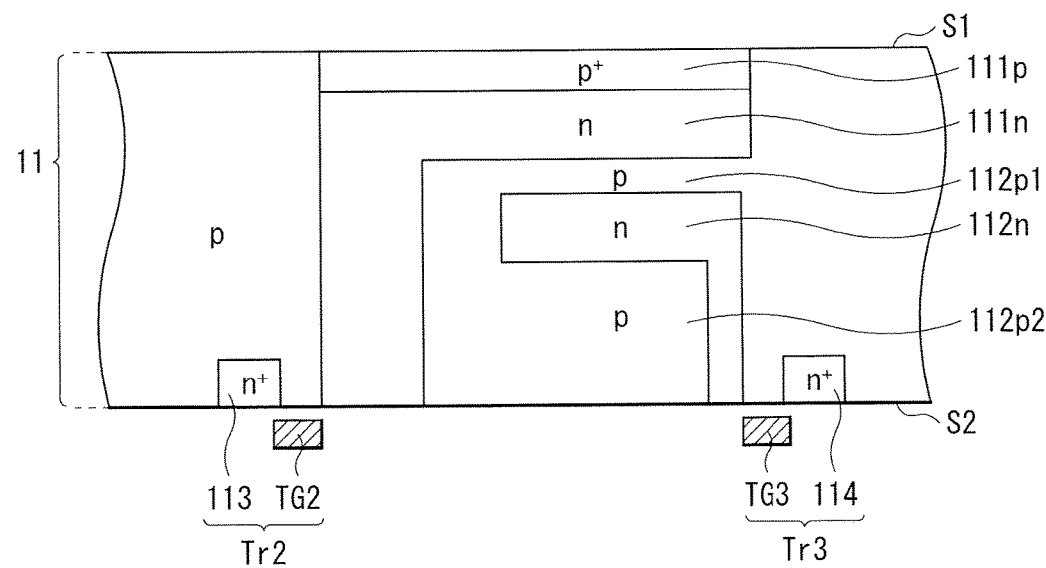
FIG. 3B is a sectional diagram illustrating a structure example of the inorganic photoelectric conversion section.

FIG. 3A and FIG. 3B each illustrate a detailed structure example of the inorganic photoelectric conversion layers 11B and 11R. FIGS. 3A and 3B illustrate structures of sectional surfaces different from each other. Incidentally, in the present embodiment, a case where an electron is read out as the signal charge, out of a pair of an electron and a hole generated by the photoelectric conversion (a case where an n-type semiconductor region serves as the photoelectric conversion layer) will be described. In addition, in the drawings, a superscript "+ (plus)" added to "p" or "n" indicates that impurity concentration of p-type or n-type is high. Moreover, out of the pixel transistors, gate electrodes TG2 and TG3 of the transfer transistors Tr2 and Tr3 are also illustrated.

For example, the inorganic photoelectric conversion layer 11B may be configured to include a p-type semiconductor region (hereinafter, simply referred to as a p-type region; the same applies to an n-type region) 111p serving as a hole accumulation layer and an n-type photoelectric conversion layer (an n-type region) 111n serving as an electron accumulation layer. Each of the p-type region 111p and the n-type photoelectric conversion layer 111n is formed in a selective region in the vicinity of the surface S1, and is partially bent and extended so as to reach an interface with the surface S2. The p-type region 111p is connected to a p-type semiconductor well region not illustrated on the surface S1 side. The n-type photoelectric conversion layer 111n is connected to the FD 113 (the n-type region) of the blue transfer transistor Tr2. Incidentally, a p-type region 113p (the hole accumulation layer) is formed in the vicinity of an interface between the surface S2 and an end on the surface S2 side of each of the p-type region 111p and the n-type photoelectric conversion layer 111n.

For example, the inorganic photoelectric conversion layer 11R may be so formed as to sandwich an n-type photoelectric conversion layer 112n (an electron accumulation layer) between p-type regions 112p1 and 112p2 (hole accumulation layers) (have a stacked layer structure of p-n-p). The n-type photoelectric conversion layer 112n is partially bent and extended so as to reach the interface with the surface S2. The n-type photoelectric conversion layer 112n is connected to the FD 114 (the n-type region) of the red transfer transistor Tr3. Incidentally, the p-type region 113p (the hole accumulation layer) is formed in the vicinity of the interface between the surface S2 and at least an end on the surface S2 side of the n-type photoelectric conversion layer 111n.

Figure 4:
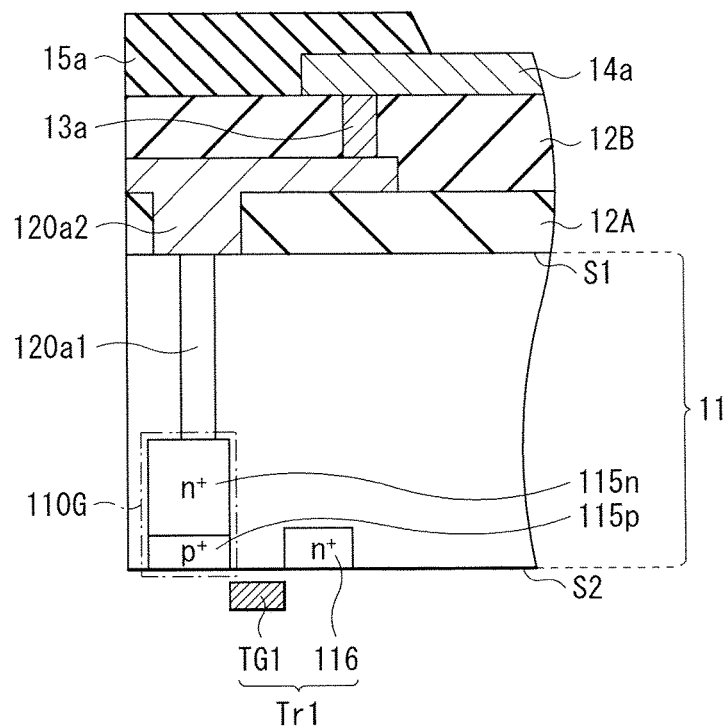
FIG. 4 is a sectional diagram illustrating a structure example of a charge (electron) accumulation layer of an organic photoelectric conversion section.

FIG. 4 illustrates a detailed structure example of the green storage layer 110G. Incidentally, here, a case where an electron is read out as the signal charge from a lower electrode 14a side, out of a pair of an electron and a hole generated by the organic photoelectric conversion section 11G, will be described. In addition, a gate electrode TG1 of the transfer transistor Tr1 out of the pixel transistors is also illustrated in FIG. 4.

The green storage layer 110G is configured to include an n-type region 115n serving as an electron accumulation layer. A part of the n-type region 115n is connected to the conductive plug 120a1, and accumulates electrons supplied from the lower electrode 14a side through the conductive plug 120a1. The n-type region 115n is also connected to the FD 116 (the n-type region) of the green transfer transistor Tr1. Incidentally, a p-type region 115p (a hole accumulation layer) is formed in the vicinity of an interface between the n-type region 115n and the surface S2.

The conductive plug 120a1 functions as a connector for the organic photoelectric conversion section 11G and the semiconductor substrate 11, together with a conductive plug 120a2 described later, and forms a transmission path of electrons or holes generated in the organic photoelectric conversion section 11G. Here, the conductive plug 120a1 is conducted with the lower electrode 14a of the organic photoelectric conversion section 11G, and is connected to the green storage layer 110G.

For example, the conductive plug 120a1 may be formed of a conductive semiconductor layer, and is embedded in the semiconductor substrate 11. In this case, the conductive plug 120a1 may be desirably of n-type because the conductive plug 120a1 serves as the transmission path of the electrons. Alternatively, for example, the conductive plug 120a1 may be formed by filling a conductive material such as tungsten in a through via. In this case, for example, a side surface of the via may be desirably covered with an insulating film formed of oxide silicon ($SiO_2$), silicon nitride (SiN), or the like in order to suppress short-circuit with silicon.

As illustrated in FIG. 1, for example, a supporting substrate 53 formed of silicon may be bonded on the surface S2 side of the semiconductor substrate 11 as described above with the multilayer wiring layer 51 in between. In the multilayer wiring layer 51, a plurality of wirings 51a and 51b are arranged with the interlayer insulating film 52 in between. In this way, in the photoelectric conversion element 10, the multilayer wiring layer 51 is formed on a side opposite to the light receiving surface, which makes it possible to achieve a so-called backside illumination type solid-state image pickup device.

(Organic Photoelectric Conversion Section)

The organic photoelectric conversion section 10a (here, the organic photoelectric conversion section 11G) is an organic photoelectric conversion element that absorbs light of a selective wavelength (here, green light) with use of an organic semiconductor, to generate a pair of an electron and a hole. The organic photoelectric conversion section 10a (11G) has a structure in which the organic photoelectric conversion layer 17 (17G) is sandwiched between the pair of electrodes (the lower electrode 14a and the upper electrode 18) that are used to extract the signal charges. The lower electrode 14a (a first electrode) is electrically connected to the conductive plug 120a1 embedded in the semiconductor substrate 11. The upper electrode 18 (a second electrode) is connected to the wiring 51a in the multilayer wiring layer 51 through a not-illustrated contact section, for example, in the peripheral part of the solid-state image pickup device, which allows charges (here, holes) to be discharged.

Figure 5:
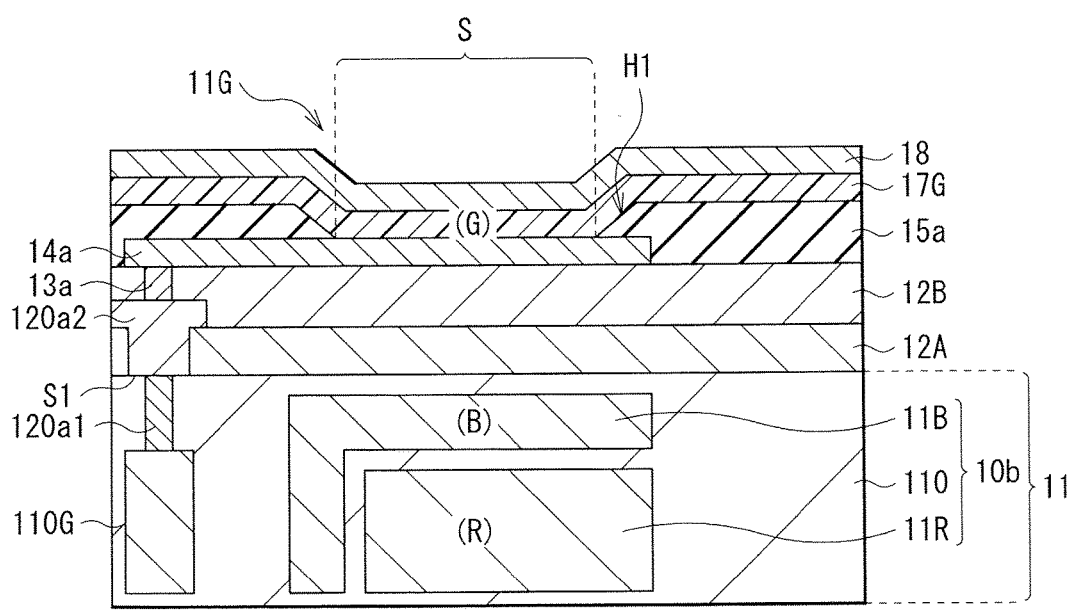
FIG. 5 is a sectional diagram for explaining a detailed structure of the organic photoelectric conversion section.

FIG. 5 is a diagram for explaining a detailed structure of the organic photoelectric conversion section 11G. The organic photoelectric conversion section 11G is formed on the surface S1 of the semiconductor substrate 11 with interlayer insulating films 12A and 12B in between. In the interlayer insulating film 12A, the conductive plug 120a2 is embedded in a region facing the conductive plug 120a1, and in the interlayer insulating film 12B, a wiring layer 13a is embedded in a region facing the conductive plug 120a2. The lower electrode 14a is provided on the interlayer insulating film 12B. An inter-pixel insulating films 15a is provided on the lower electrode 14a, and the inter-pixel insulating film 15a is provided with an opening section H1 facing the lower electrode 14a. The organic photoelectric conversion layer 17G is formed from an inside of the opening section H1 of such an inter-pixel insulating film 15a (an upper surface of the lower electrode 14a) to the peripheral region thereof. The upper electrode 18 is so provided as to cover the organic photoelectric conversion layer 17G, and a protection film 19 and a planarization layer 20 are stacked in this order on the upper electrode 18.

The conductive plug 120a2 functions as a connecter together with the conductive plug 120a1 as described above, and forms a transmission path of charges (electrons) from the lower electrode 14a to the green storage layer 110G together with the conductive plug 120a1 and the wiring layer 13a. The conductive plug 120a2 may function as a light shielding film, and in this case, for example, the conductive plug 120a2 may be desirably formed of a stacked layer film made of a meal material such as titanium (Ti), titanium nitride (TiN), and tungsten.

The interlayer insulating film 12A may be desirably configured of an insulating film with small interface state in order to reduce interface state with the semiconductor substrate 11 (the silicon layer 110) and to suppress occurrence of dark current from an interface with the silicon layer 110. As such an insulating film, for example, a stacked layer film of a hafnium oxide ($HfO_2$) film and a silicon oxide ($SiO_2$) film may be used. For example, the interlayer insulating film 12B may be formed of a single layer film made of one of silicon oxide, silicon nitride, silicon oxynitride (SiON), and the like, or a stacked layer film formed of two or more thereof The lower electrode 14a is provided in a region that is opposed to the light receiving surfaces of the inorganic photoelectric conversion layers 11B and 11R formed in the semiconductor substrate 11 and covers the light receiving surfaces. The lower electrode 14a is formed of a conductive film that has light permeability and has a refractive index of, for example, 1.8 to 2.0 both inclusive, such as indium tin oxide (ITO). However, in addition thereto, tin oxide (TO), a tin oxide ($SnO_2$)-based material added with a dopant, or a zinc oxide-based material obtained by adding a dopant to zinc oxide (ZnO) may be used. Examples of the zinc oxide-based material may include, for example, aluminum zinc oxide (AZO) obtained by adding aluminum (Al) as a dopant, gallium zinc oxide (GZO) obtained by adding gallium (Ga) as a dopant, and indium zinc oxide (IZO) obtained by adding indium (In) as a dopant. Moreover, in addition thereto, CuI, $InSbO_4$, ZnMgO, $CuInO_2$, $MgIN_2O_4$, CdO, $ZnSnO_3$, and the like may be used. Incidentally, in the present embodiment, since the signal charges (the electrons) are extracted from the lower electrode 14a as described above, the lower electrode 14a is separated for each pixel by the inter-pixel insulating film 15a in a solid-state image pickup device using the photoelectric conversion element 10 as a pixel described later.

For example, the inter-pixel insulating film 15a may be formed of a single layer film made of one of silicon oxide, silicon nitride, silicon oxynitride (SiON), and the like, or a stacked layer film made of two or more thereof. The inter-pixel insulating film 15a has a function of electrically separating between the lower electrodes 14a of the respective pixels in a case where the photoelectric conversion element 10 is used as the pixel of the solid-state image pickup device. Although the detail will be described later, the shape and the size of the opening section H1 of the inter-pixel insulating film 15a are set such that the sensitivity (the sensitivity to the light incident angle) of the organic photoelectric conversion section 11G exhibits predetermined characteristics.

The photoelectric conversion layer 17 is formed of an organic semiconductor that absorbs light of a selective wavelength range to perform photoelectric conversion and allows light of other wavelength range to pass therethrough.

The organic photoelectric conversion element 17 may desirably include one or both of an organic p-type semiconductor and an organic n-type semiconductor, as the organic semiconductor. As such an organic semiconductor, one of a quinacridone derivative, a naphthalene derivative, an anthracene derivative, a phenanthrene derivative, a tetracene derivative, a pyrene derivative, a perylene derivative, and a fluoranthene derivative is suitably used. Alternatively, a polymer of phenylenevinylene, fluorene, carbazole, indole, pyrene, pyrrol, picoline, thiophene, acetylene, diacetylene, or the like, or a derivative thereof may be used. In addition, metal complex dyes, rhodamine-based dyes, cyanine-based dyes, merocyanine-based dyes, phenyixanthene-based dyes, triphenylmethane-based dyes, rhodacyanine-based dyes, xanthene-based dyes, macrocyclic azaannulene-based dyes, azulene-based dyes, naphthoquinone, anthraquinone-based dyes, chain compounds with condensed polycyclic aromatic compound and aromatic ring such as anthracene and pyrene or condensed heterocyclic compound, or two nitrogen-containing heterocyclic ring with squarylium group and croconic methine group as a binding chain, such as quinoline, benzothiazole, and benzoxazole, or dyes similar to cyanine-based dyes bound by squarylium group and croconic methine group may be preferably used. Note that, as the above-described metal complex dyes, ditiol metal complex dyes, metal phthalocyanine dyes, metalloporphyrin dyes, or ruthenium complex dyes are preferable; however, the metal complex dyes are not limited thereto. In the present embodiment, the organic photoelectric conversion layer 17G may photoelectrically convert the green light corresponding to a part or all of the wavelength range of, for example, 495 nm to 570 nm both inclusive, and includes one or two or more of the above-described materials. A thickness of such an organic photoelectric conversion layer 17G may be, for example, 50 nm to 500 nm both inclusive.

Incidentally, two or more kinds of organic semiconductors (for example, a p-type organic semiconductor and an n-type organic semiconductor) are evaporated at a time, and an organic codeposition film that is a composite film of these organic semiconductors may be used as the organic photoelectric conversion layer 17. Moreover, not-illustrated other layers may be provided between the organic photoelectric conversion layer 17 and the lower electrode 14a and between the organic photoelectric conversion layer 17 and the upper electrode 18. For example, an undercoat film, an electron blocking film, the organic photoelectric conversion layer 17, a hole blocking film, a buffer film, a work function adjustment film, and the like may be stacked in order from the lower electrode 14a side.

The upper electrode 18 is formed of an inorganic conductive film having light permeability similar to the lower electrode 14a. Incidentally, in the case where the signal charges are extracted from the lower electrode 14a side as with the present embodiment, the upper electrode 18 is provided common to the respective pixels.

Figure 6A:
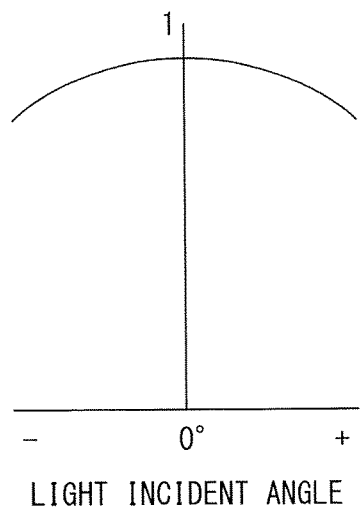
FIG. 6A is a sectional diagram for explaining light incident angle dependency of sensitivity.
Figure 6B:
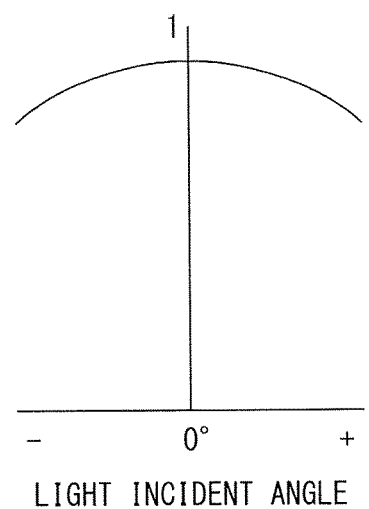
FIG. 6B is a sectional diagram for explaining light incident angle dependency of sensitivity.

The sensitivity to the light incident angle (hereinafter, referred to as light incident angle-sensitivity characteristics) of the organic photoelectric conversion section 10a (11G) is equivalent to light incident angle-sensitivity characteristics of the inorganic photoelectric conversion section 10b (11B and 11R). Here, the light incident angle-sensitivity characteristics of the organic photoelectric conversion section 10a (11G) are illustrated in FIG. 6A, and the light incident angle-sensitivity characteristics of the inorganic photoelectric conversion section 10b (11B and 11R) are illustrated in FIG. 6B. Incidentally, in these drawings, an incident angle of a light beam entering along the direction vertical to the main surface of the semiconductor substrate 11 is assumed to be 0 degrees, and the sensitivity in the case where the light incident, angle is 0 degrees is normalized as 1. Although the detail will be described later, as illustrated in FIG. 6B, in the inorganic photoelectric conversion section 10b (11B and 11R), the sensitivity tends to decrease as the light incident angle θ is increased (θ>0, θ<0). Note that the inorganic photoelectric conversion section 10b has a structure in which the two inorganic photoelectric conversion layers 11B and 11R are stacked in this example; however, a distance (several tens nm to several hundred nm) between the inorganic photoelectric conversion layers 11B and 11R is extremely small as compared with a distance (about several µm or lower) between the inorganic photoelectric conversion section 10b and the organic photoelectric conversion section 10a. Therefore, the light incident angle-sensitivity characteristics of the inorganic photoelectric conversion layers 11B and 11R that are formed in the semiconductor substrate 11 are assumed to be equivalent to each other. In the present embodiment, the organic photoelectric conversion section 10a (11G) is designed such that the light incident angle-sensitivity characteristics of the organic photoelectric conversion section 10a (11G) become equivalent to (desirably, completely coincide with) the light incident angle-sensitivity characteristics of such an inorganic photoelectric conversion section 10b (11B and 11R).

Figure 7:
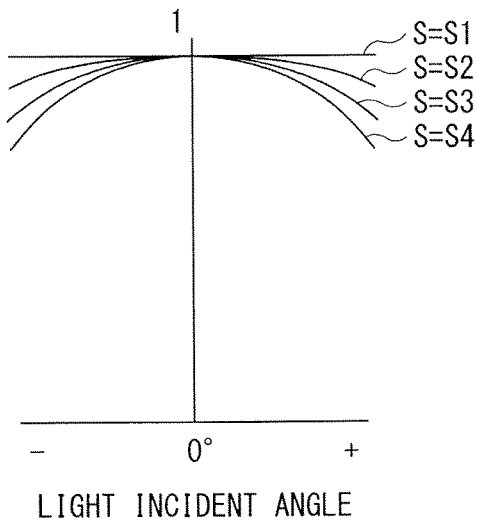
FIG. 7 is a sectional diagram for explaining light incident angle dependency of sensitivity.

Specifically, since the light incident angle-sensitivity characteristics of the organic photoelectric conversion section. 10a (11G) are determined according to a bonding area S between the lower electrode 14a and the organic photoelectric conversion layer 17, the bonding area S is adjusted for each pixel. Incidentally, as illustrated in FIG. 7, when the bonding area S is stepwisely decreased, (S1>S2>S3>S4), the sensitivity decreases in a range of larger light incident angle. In the present embodiment, since the bonding area S is equal to the opening area of the opening H1, the opening area is adjusted to obtain the above-described light incident angel-sensitivity characteristics.

Figure 8A:
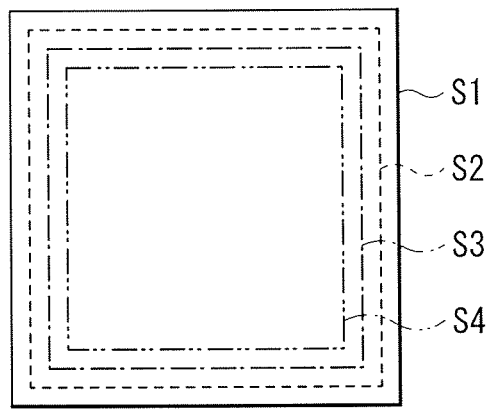
FIG. 8A is a schematic diagram illustrating an example of a shape of an opening section of a pixel insulating film.
Figure 8B:
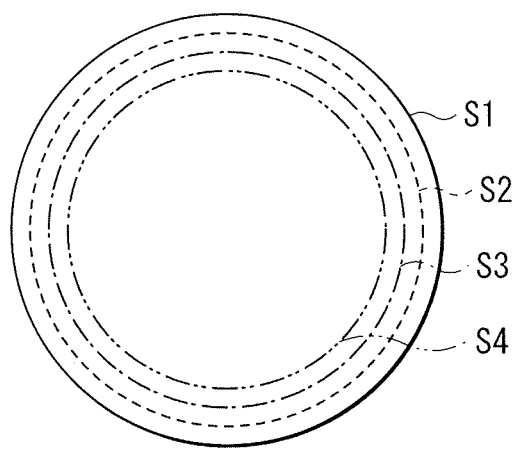
FIG. 8B is a schematic diagram illustrating an example of the shape of the opening section of the pixel insulating film.
Figure 8C:
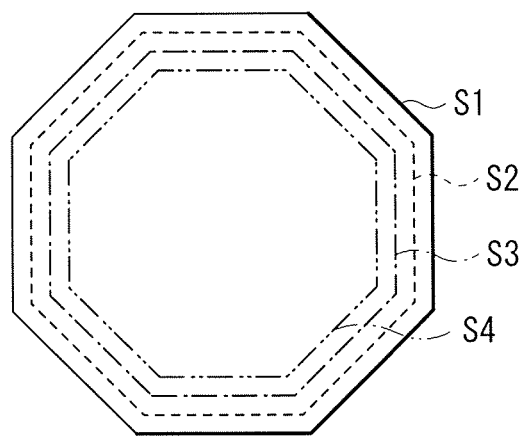
FIG. 8C is a schematic diagram illustrating an example of the shape of the opening section of the pixel insulating film.

FIG. 8A to FIG. 8C each illustrate an example of the shape and the opening area of the opening section H1. Examples of the shape of the opening section H1 may include, for example, a square (FIG. 8A), a circle (FIG. 8B), and a regular octagon (FIG. 8C). However, the shape of the opening section H1 is not limited thereto, and may be a rectangular shape or other polygonal shapes. In the present embodiment, the opening area (S1, S2, S3, S4, . . . ) is so set for each pixel as to exhibit the light incident angle-sensitivity characteristics as described above. The light incident angle dependency of the sensitivity becomes high as the opening area decreases (the sensitivity easily decreases as the light incident angle increases).

The protection film 19 may be formed of, for example, an inorganic material having light permeability, and for example, may be a single layer film made of any of silicon oxide, silicon nitride, silicon oxynitride, and the like, or may be a stacked layer film made of two or more thereof. A thickness of the protection film 19 may be, for example, 0.1 µm to 30 µm both inclusive.

For example, the planarization layer 20 may be formed of an acrylic-based resin material, a styrene-based resin material, an epoxy-based resin material, or the like. An on-chip lens 21 is provided on the planarization layer 20. Incidentally, it is sufficient to provide the planarization layer 20 as necessary, and the above-described protection layer 19 may function as the planarization film 20.

The on-chip lens 21 concentrates the light incident from above on the light receiving surface of each of the organic photoelectric conversion layer 17G and the inorganic photoelectric conversion layers 11B and 11R. In the present embodiment, since the multilayer wiring layer 51 is formed on the surface S2 side of the semiconductor substrate 11, the light receiving surfaces of the organic photoelectric conversion layer 17G and the inorganic photoelectric conversion layers 11B and 11R are allowed to be provided closely from one another, and it is possible to reduce variation of the sensitivity between colors caused depending on the F-value of the on-chip lens 21.

(Manufacturing Method)

The photoelectric conversion element 10 as described above may be manufactured in the following manner, for example. FIG. 9 to FIG. 14 each illustrate the method of manufacturing the photoelectric conversion element 10 in the process order. Incidentally, in this example, only the structure of the main part of the photoelectric conversion element 10 is illustrated, and the procedure in the case where the organic photoelectric conversion section 11G is formed on the surface S1 side of the semiconductor substrate 11 will be specifically described.

Incidentally, although not illustrated, before formation of the organic photoelectric conversion section 11G, the semiconductor substrate 11 having the inorganic photoelectric conversion section 10b (11B and 11R) is formed, and the multilayer wiring layer 51 and the supporting substrate 53 are formed on the surface S2 side of the semiconductor substrate 11. Specifically, first, a silicon layer 110 is formed on a temporary substrate made of, for example, a silicon oxide film, and the conductive plug 120a1, the green storage layer 110G, and the inorganic photoelectric conversion layers 11B and 11R are embedded in the silicon layer 110 by, for example, ion implantation to form the semiconductor substrate 11. After that, the pixel transistors including the transfer transistors Tr1 to Tr3, the peripheral circuits such as a logic circuit, and the multilayer wiring layer 51 are formed on the surface S2 side of the semiconductor substrate 11. Subsequently, after the supporting substrate 53 is bonded on the multilayer wiring layer 51, the above-described temporary substrate is detached from the surface S1 side of the semiconductor substrate 11 to allow the surface S1 of the semiconductor substrate 11 to be exposed.

Figure 9:
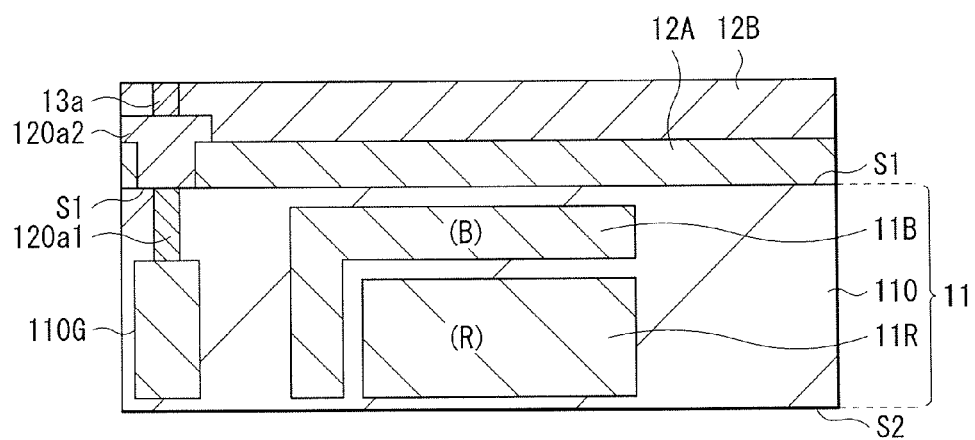
FIG. 9 is a sectional diagram for explaining a method of manufacturing the photoelectric conversion element illustrated in FIG. 1.

First, as illustrated in FIG. 9, the interlayer insulating films 12A and 12B are formed on the surface S1 of the semiconductor substrate 11. Specifically, first, the interlayer insulating film 12A that is made of a stacked layer film of a hafnium oxide film and a silicon oxide film as described above is formed on the surface S1 of the semiconductor substrate 11. At this time, after the hafnium oxide film is formed by, for example, an atomic layer deposition (ALD) method, the silicon oxide film is formed by, for example, a plasma CVD method. After that, a region of the interlayer insulating film 12A facing the conductive plug 120a1 is opened, and the conductive plug 120a2 made of the above-described material is formed. Subsequently, the interlayer insulating film 12B made of the above-described material is formed on the interlayer insulating film 12A by, for example, the plasma CVD method. Then, a region of the interlayer insulating film 12B facing the conductive plug 120a2 is opened, and the wiring layer 13a made of the above-described material is formed.

Figure 10:
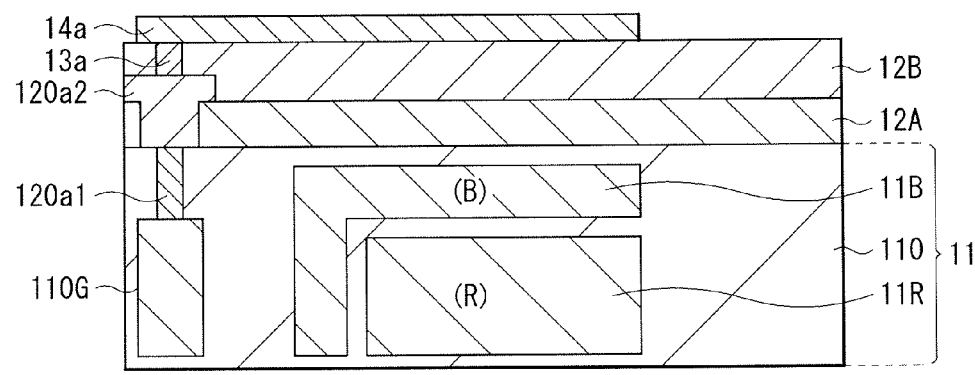
FIG. 10 is a sectional diagram illustrating a process following the process of FIG. 9.

Subsequently, as illustrated in FIG. 10, the lower electrode 14a is formed on the interlayer insulating film 12B. Specifically, first, the above-described transparent conductive film is formed over the entire surface of the interlayer insulating film 12B. Examples of the film forming method may include, for example, a sol-gel method, a spin coating method, a spray method, a roll coating method, an ion beam deposition method, an electron beam deposition method, a laser ablation method, a CVD method, and a sputtering method. Incidentally, in particular, to form the lower electrode 14a having a large area and a uniform thickness, the sputtering method out of the above-described methods may be desirably used. After that, patterning is performed with use of, for example, dry etching (or wet etching) using a photolithography method to form the lower electrode 14a. At this time, the lower electrode 14a is formed in a region facing the wiring layer 13a so as to be electrically connected to the green storage layer 110G through the wiring layer 13a and the conductive plugs 120a1 and 120a2.

Figure 11A:
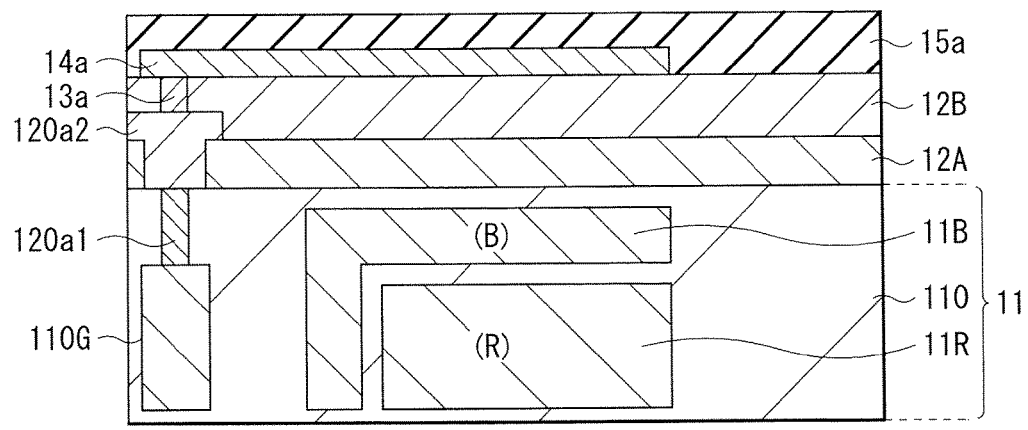
FIG. 11A is a sectional diagram illustrating a process following the process of FIG. 10.

Subsequently, as illustrated in FIG. 11A, the inter-pixel insulating film 15a is formed. Specifically, the inter-pixel insulating film 15a made of the above-described material may be so formed over the entire surface of the semiconductor substrate 11 by, for example, the plasma CVD method as to cover the interlayer insulating film 12B and the lower electrode 14a. Then, a surface of the formed inter-pixel insulating film 15a is planarized using, for example, a chemical mechanical polishing (CMP) method.

Figure 11B:
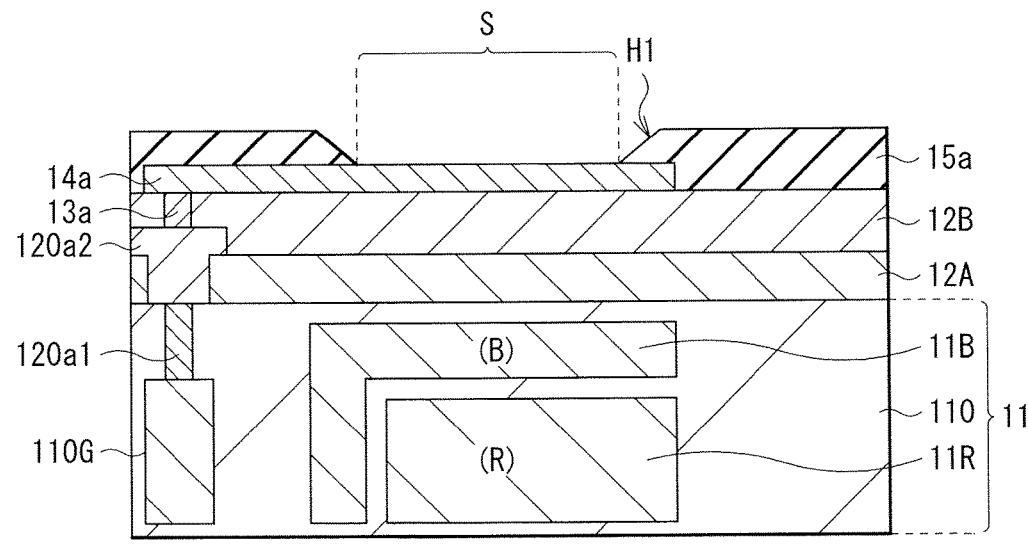
FIG. 11B is a sectional diagram illustrating a process following the process of FIG. 11A.

After that, as illustrated in FIG. 11B, the opening section H1 is formed in the inter-pixel insulating film 15a. Specifically, a region of the inter-pixel insulating film 15a facing the lower electrode 14a is selectively removed by, for example, the dry etching using the photolithography method. As a result, the surface of the lower electrode 14a is exposed from the inter-pixel insulating film 15a. At this time, the opening area (the contact area S), the shape, etc. of the opening section H1 are set so as to exhibit the light incident angle-sensitivity characteristics as described above for each pixel.

Figure 12:
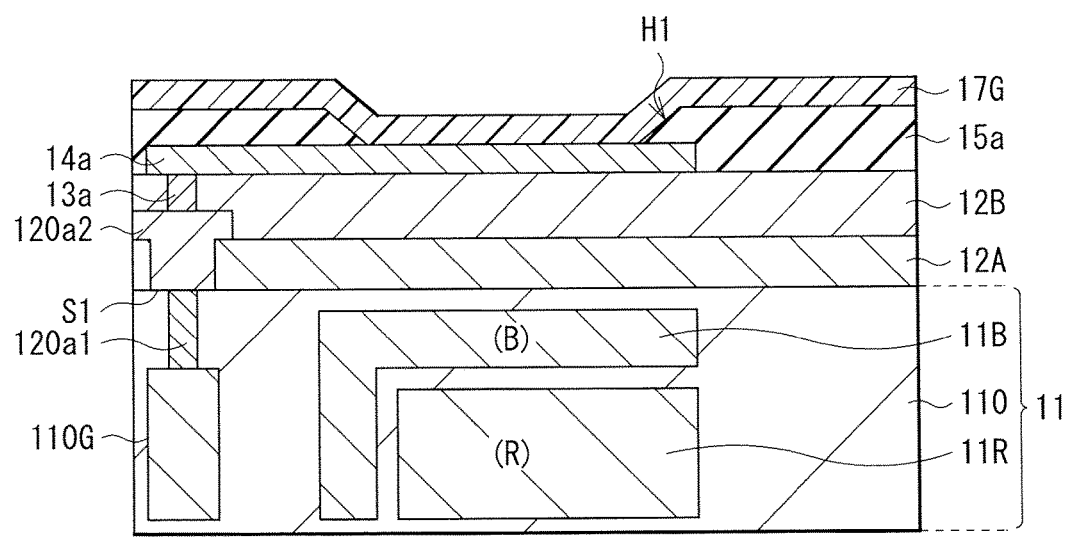
FIG. 12 is a sectional diagram illustrating a process following the process of FIG. 11B.

Subsequently, as illustrated in FIG. 12, the organic photoelectric conversion layer 17G made of the above-described material and the like is formed using, for example, a vacuum deposition method. As a result, the organic photoelectric conversion layer 17G is formed in contact with the lower electrode 14a in the opening section H1.

Figure 13:
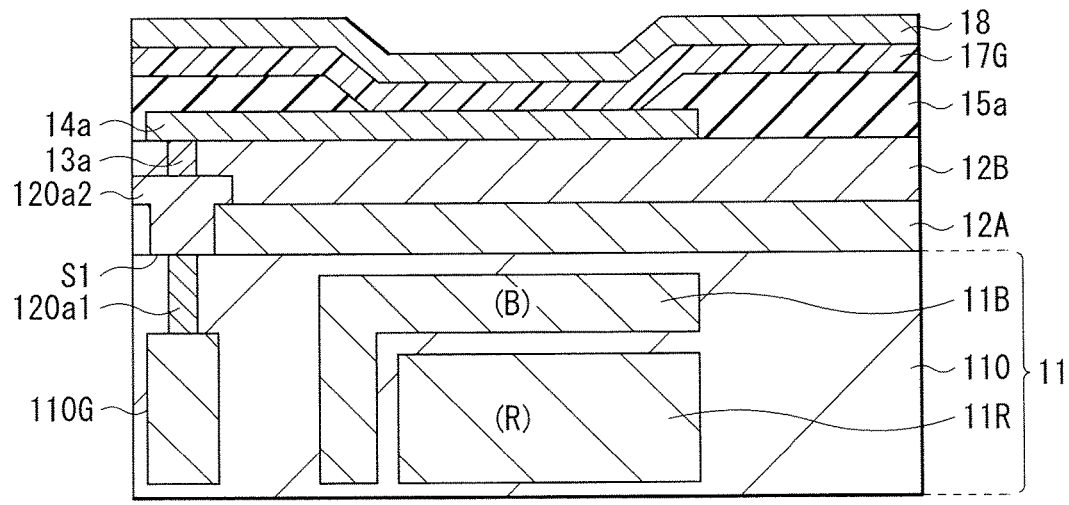
FIG. 13 is a sectional diagram illustrating a process following the process of FIG. 12.

After that, as illustrated in FIG. 13, the upper electrode 18 is formed. Specifically, the above-described conductive film is formed on the organic photoelectric conversion layer 17 over the entire surface of the semiconductor substrate 11 by, for example, the vacuum deposition method, the sputtering method, or the like. At this time, the conductive film may be desirably formed successively with the organic photoelectric conversion layer 17 in the vacuum atmosphere (in vacuum consistent process). After the conductive film is formed in such a way, the conductive film is patterned by, for example, the etching using the photolithography method to form the upper electrode 18. Incidentally, at this time, the organic photoelectric conversion layer 17G may be patterned at the same time.

Figure 14:
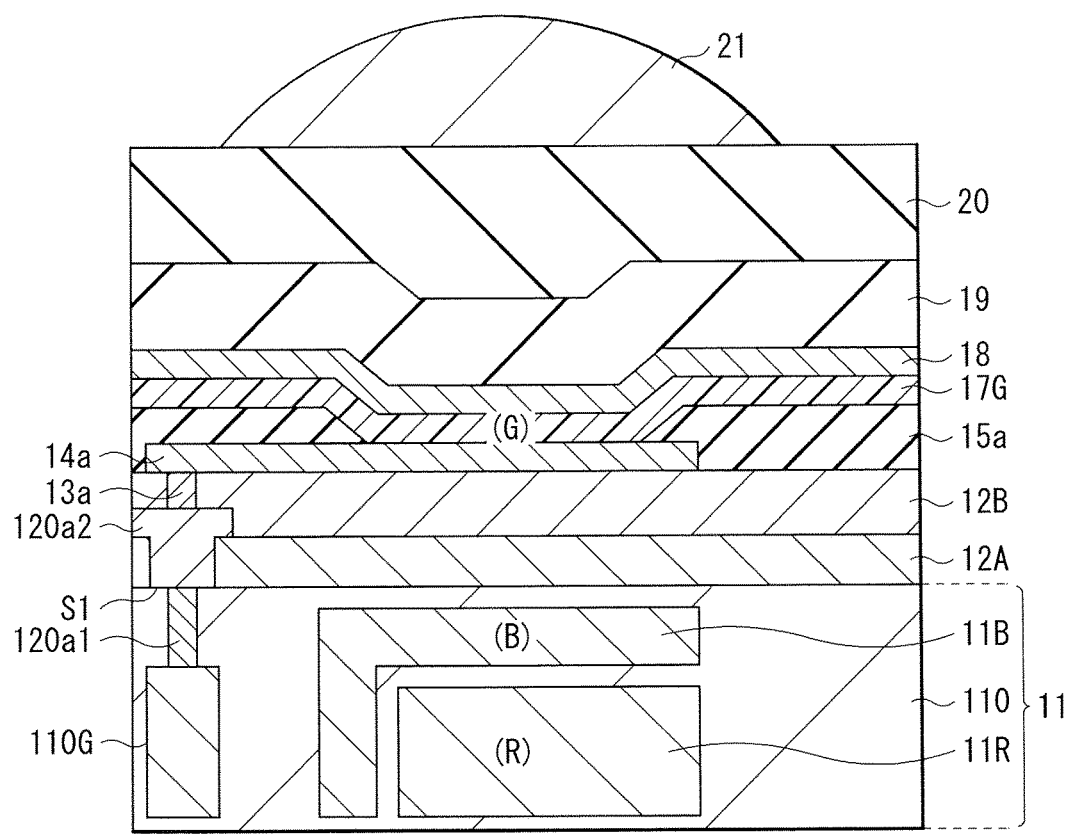
FIG. 14 is a sectional diagram illustrating a process following the process of FIG. 13.

Finally, as illustrated in FIG. 14, after the protection layer 19 is formed on the upper electrode 18 by, for example, the plasma CVD method, the planarization layer 20 is formed by, for example, the spin coating method. After that, the on-chip lens 21 is formed on the planarization layer 20 to complete the photoelectric conversion element 10 illustrated in FIG. 1.

(Function and Effects)

In the photoelectric conversion element 10 in the present embodiment, for example, the signal charges are acquired in the following manner, as the pixel of the solid-state image pickup device. Specifically, when the light enters the photoelectric conversion element 10 through the on-chip lens 21, the incident light passes through the organic photoelectric conversion section 10*a* (11G) and the inorganic photoelectric conversion section 10*b* (the inorganic photoelectric conversion layers 11B and 11R) in order, and the incident light is photoelectrically converted for each color light of red, green, and blue in the passing process.

Specifically, first, the green light is selectively detected (absorbed) by the organic photoelectric conversion section 11G and then is photoelectrically converted. As a result, for example, after the electron is extracted from the lower electrode 14*a* side out of the generated pair of an electron and a hole, the electrons are accumulated in the green storage layer 110G through the wiring layer 13*a* and the conductive plugs 120*a*1 and 120*a*2. Incidentally, the holes are discharged through a not-illustrated wiring layer from the upper electrode 18 side. After that, out of the light that has passes through the organic photoelectric conversion section 11G, the blue light and the red light are absorbed by the inorganic photoelectric conversion layer 11B and the inorganic photoelectric conversion layer 11R, respectively, in this order, and are photoelectrically converted. In the inorganic photoelectric conversion layer 11B, the electrons corresponding to the blue light are accumulated in the n-type region (the n-type photoelectric conversion layer 111*n*). Likewise, in the inorganic photoelectric conversion layer 11R, the electrons corresponding to the red light are accumulated in the n-type region (the n-type photoelectric conversion layer 112*n*).

At the time of the readout operation, the transfer transistors Tr1, Tr2, and Tr3 are put into the on state, and the electrodes respectively accumulated in the green storage layer 110G and the n-type photoelectric conversion layers 111*n* and 112*n* are transferred to the FDs 113, 114, and 116. As a result, the light receiving signal of each color is read out to the vertical signal line Lsig described later through not-illustrated other pixel transistors. In this way, stacking the organic photoelectric conversion section 11G and the inorganic photoelectric conversion layers 11B and 11R in the vertical direction makes it possible to separate and detect color light of red, green, and blue and to obtain the signal charges of each color without providing color filters.

Comparative Examples

Figure 15A:
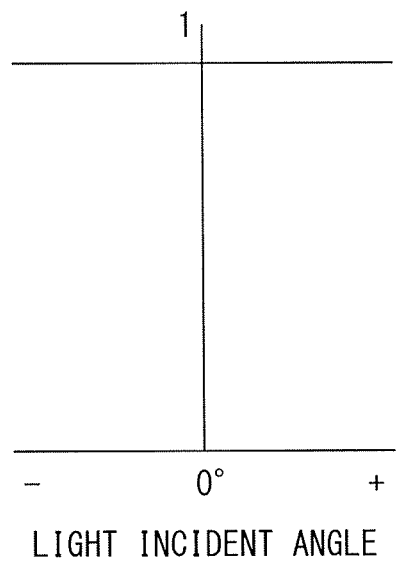
FIG. 15A is a characteristic diagram for explaining light incident angle dependency of sensitivity.
Figure 15B:
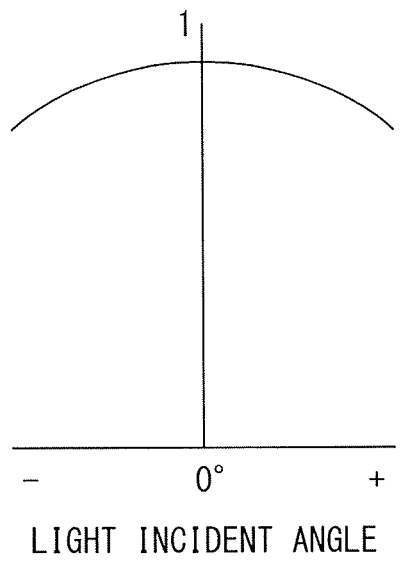
FIG. 15B is a characteristic diagram for explaining light incident angle dependency of sensitivity.

FIG. 15A and FIG. 15B each illustrate light incident angle-sensitivity characteristics of a photoelectric conversion element according to a comparative example of the present embodiment. FIG. 15A illustrates the light incident angle-sensitivity characteristics of an organic photoelectric conversion section, and FIG. 15B illustrates the light incident angle-sensitivity characteristics of an inorganic photoelectric conversion section. Incidentally, also in the comparative example, it is assumed that the inorganic photoelectric conversion section is formed in a semiconductor substrate, and the organic photoelectric conversion section is formed on the semiconductor substrate.

Figure 16A:
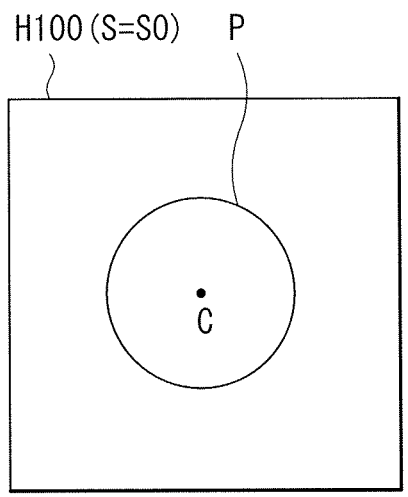
FIG. 16A is a schematic diagram for explaining relationship between an opening area and sensitivity.
Figure 16B:
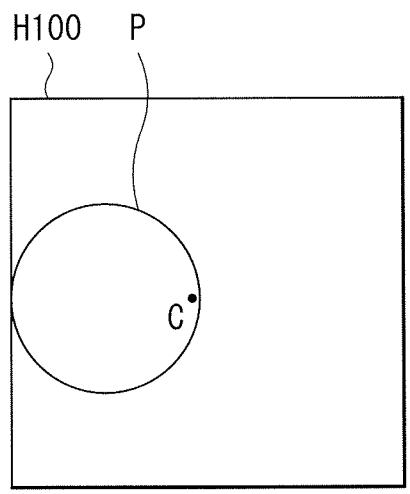
FIG. 16B is a schematic diagram for explaining relationship between the opening area and sensitivity.

As illustrated in FIG. 15A, in the comparative example, the sensitivity of the organic photoelectric conversion section is difficult to be varied and is constant even when the light incident angle is varied. The reason is described with reference to FIG. 16A and FIG. 16B. FIG. 16A and FIG. 16B are diagrams for explaining positional relationship between an opening section (an opening section H100) in the comparative example (a contact area S=S0), and a light condensed spot P by an on-chip lens. When the light incident angle is 0 degrees, the light condensed spot P is formed at about center part C of the opening section H100 as illustrated in FIG. 16A. On the other hand, when the light incident angle becomes θ (θ>0), the light condensed spot P is shifted from the center part C of the opening section H100 and is formed at an end part as illustrated in FIG. 16B; however, since the organic photoelectric conversion section and the on-chip lens are located relatively close to each other, the light condensed spot P is difficult to be shifted from the opening section H100. Therefore, the pixel output from the organic photoelectric conversion section becomes constant easily irrespective of the light incident angle.

On the other hand, as illustrated in FIG. 15B, the sensitivity of the inorganic photoelectric conversion section becomes lower easily when the light incident angle is increased. This is because the inorganic photoelectric conversion section is formed at a position far away from the on-chip lens, and the light condensed spot P largely moves as the light incident angle θ increases, and thus the light is difficult to be condensed in the inorganic photoelectric conversion section. Incidentally, it is considered that the inorganic photoelectric conversion section is formed larger in order to enhance the sensitivity in the case where the light incident angle is large. However, since the various kinds of transistors and wiring layers as described above are formed in the semiconductor substrate, the size and the layout of the inorganic photoelectric conversion section are restricted and such a method is difficult in design. Moreover, there is a case where a metal light shielding film is provided to prevent light from entering regions other than the inorganic photoelectric conversion section, and the light incident angle dependency of the sensitivity of the inorganic photoelectric conversion section becomes larger due to vignetting of light by the metal light shielding film.

From the characteristics illustrated in FIG. 15A and FIG. 15B, the ratio of the pixel output from the organic photoelectric conversion section to the pixel output from the inorganic photoelectric conversion section is varied along with the variation of the light incident angle. Therefore, when the same signal processing not considering the light incident angle is performed with use of these pixel outputs to obtain color information of the respective pixels, color reproducibility is degraded. On the other hand, when the signal processing method is changed depending on the light incident angle, a circuit for the signal processing is separately mounted on the solid-state image pickup device or a semiconductor chip for the signal processing is used separately from the solid-state image pickup device, and thus the cost is increased.

Figure 17A:
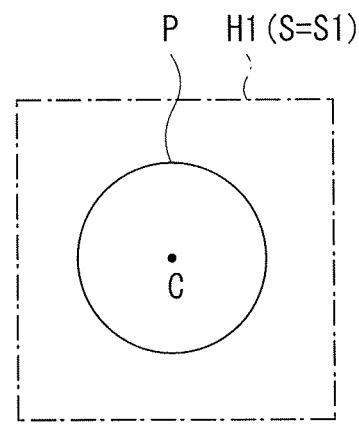
FIG. 17A is a schematic diagram for explaining relationship between the opening area and sensitivity.
Figure 17B:
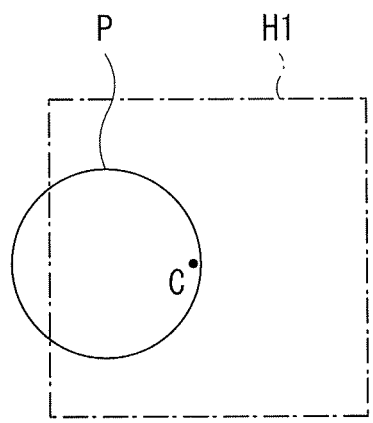
FIG. 17B is a schematic diagram for explaining relationship between the opening area and sensitivity.

In contrast thereto, in the present embodiment, as illustrated in FIG. 6A and FIG. 6B, the organic photoelectric conversion section 10*a* (11G) is designed such that the light incident angle-sensitivity characteristics of the organic photoelectric conversion section 10*a* (11G) are equivalent to (desirably, are completely coincident with) the light incident angle-sensitivity characteristics of the inorganic photoelectric conversion section 10*b* (11B and 11R). Specifically, the opening area of the opening section H1 of the inter-pixel insulating film 15*a* is adjusted. Here, the positional relationship between the opening section H1 (the contact area S=S1<S0) and the light condensed spot P by the on-chip lens 21 is illustrated in FIG. 17A and FIG. 17B. When the light incident angle is 0 degrees, the light condensed spot P is formed substantially at the center part C of the opening section H1 as illustrated in FIG. 17A. On the other hand, when the light incident angle becomes θ (θ>0), the light condensed spot P is shifted from the center part C of the opening section H1 and thus the light condensed spot P is not partially included in the opening section H1 as illustrated in FIG. 17B. Therefore, it is possible to decrease the pixel output from the organic photoelectric conversion section 10a (11G) in response to increase of the light incident angle. Accordingly, the light incident angle dependency of the sensitivity of the organic photoelectric conversion section 10a (11G) becomes equivalent to the light incident angle dependency of the sensitivity of the inorganic photoelectric conversion section 10b (11B and 11R) (the difference between the light incident angle dependencies in the respective photoelectric conversion sections is decreased). As a result, even when the light incident angle is varied, the ratio of the pixel output from the organic photoelectric conversion section 10a (11G) to the pixel output from the inorganic photoelectric conversion section 10b (11B and 11R) becomes substantially constant.

As described above, in the present embodiment, the light incident angle-sensitivity characteristics of the stacked organic photoelectric conversion section 10a and inorganic photoelectric conversion section 10b are equivalent to each other for each pixel. Therefore, it is possible to suppress variation in the ratio of the pixel outputs in respective colors. Accordingly, it is possible to improve color reproducibility irrespective of the signal processing.

Incidentally, in the above-described first embodiment, the case where the photoelectric conversion of the green light is performed in the organic photoelectric conversion section 10a and the photoelectric conversion of the blue light and the red light is performed in the inorganic photoelectric conversion section 10b has been described. However, color combination in each photoelectric conversion section (apportionment of P, G, and B) is not limited thereto. Specifically, an organic photoelectric conversion layer performing the photoelectric conversion of the blue light (or the red light) may be provided in the organic photoelectric conversion section 10a, and two inorganic photoelectric conversion layers performing the photoelectric conversion of the green light and the red light (or the blue light and the green light) may be provided in the inorganic photoelectric conversion section 10b. However, it is desirable that a photoelectric conversion layer with shorter wavelength be formed on a light incident side in each of the organic photoelectric conversion section 10a and the inorganic photoelectric conversion section 10b (in each photoelectric conversion section).

Next, photoelectric conversion elements (pixels) according to second to sixth embodiments of the disclosure will be described. Incidentally, hereinafter, like numerals are used to designate substantially like components of the above-described embodiment, and the description thereof is appropriately omitted.

Second Embodiment

Figure 18:
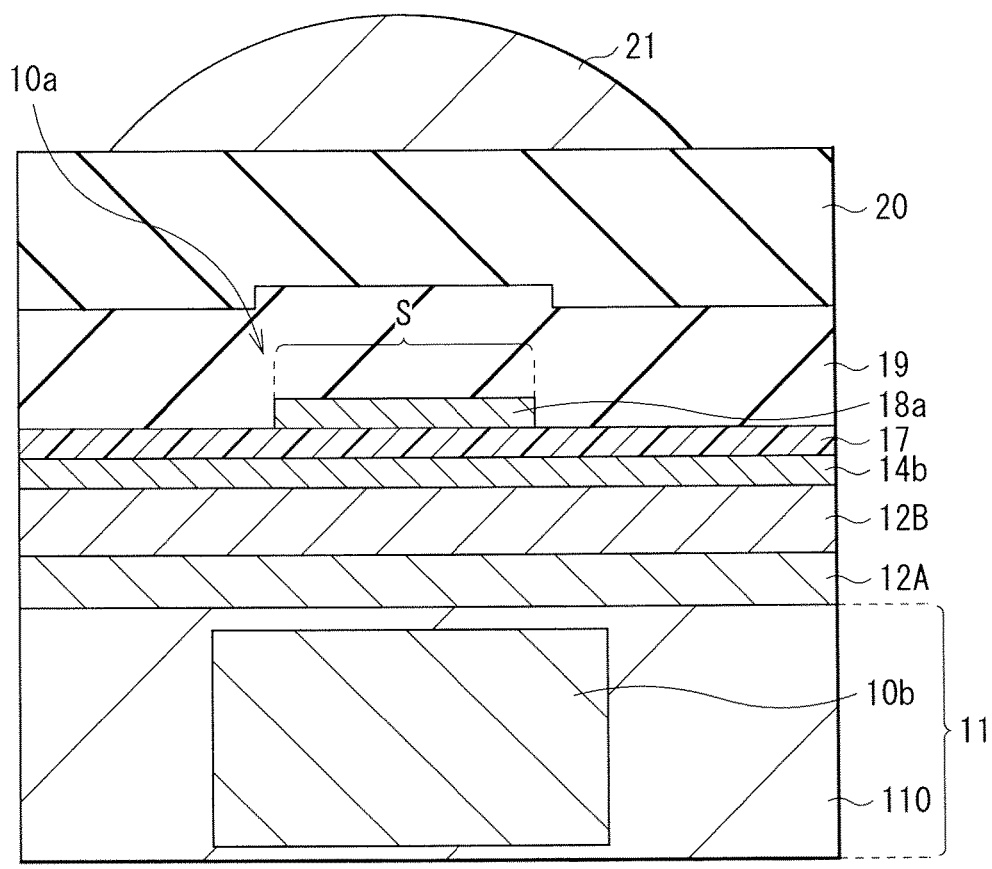
FIG. 18 is a sectional diagram illustrating a structure of a main part of a photoelectric conversion element (a pixel) according to a second embodiment of the disclosure.

FIG. 18 illustrates a structure of a main part of a photoelectric conversion element according to the second embodiment. The case were the signal charges are extracted from the lower electrode 14a in a structure in which the lower electrode 14a is separated for each pixel has been described in the above-described first embodiment; however, the structure in which the upper electrode 18a is separated for each pixel may be employed. In this case, the signal charges are allowed to be extracted from the upper electrode 18a, and the lower electrode 14b is allowed to be provided common to the respective pixels.

Also in the present embodiment, similarly to the above-described first embodiment, the light incident angle-sensitivity characteristics of the organic photoelectric conversion section 10a and the inorganic photoelectric conversion section 10b are equivalent to each other for each pixel. However, in the present embodiment, the light incident angle-sensitivity characteristics of the organic photoelectric conversion section 10a are set according to the contact area S between the upper electrode 18a and the organic photoelectric conversion layer 17. In other words, the sensitivity is defined by the area of the surface of the upper electrode 18a on the organic photoelectric conversion layer 17 side.

Also in such a case, similarly to the above-described embodiment, the light incident angle-sensitivity characteristics of the organic photoelectric conversion section 10a and the inorganic photoelectric conversion section 10b are equivalent to each other for each pixel, which makes it possible to suppress variation of the ratio of the pixel outputs in respective colors. Accordingly, it is possible to obtain effects equivalent to those in the above-described first embodiment.

Moreover, in the present embodiment, since the insulating film is not formed on the lower electrode 14b, the flatness of the device surface is high, and the planarization film 20 and the on-chip lens 21 are allowed to be easily formed.

Third Embodiment

Figure 19:
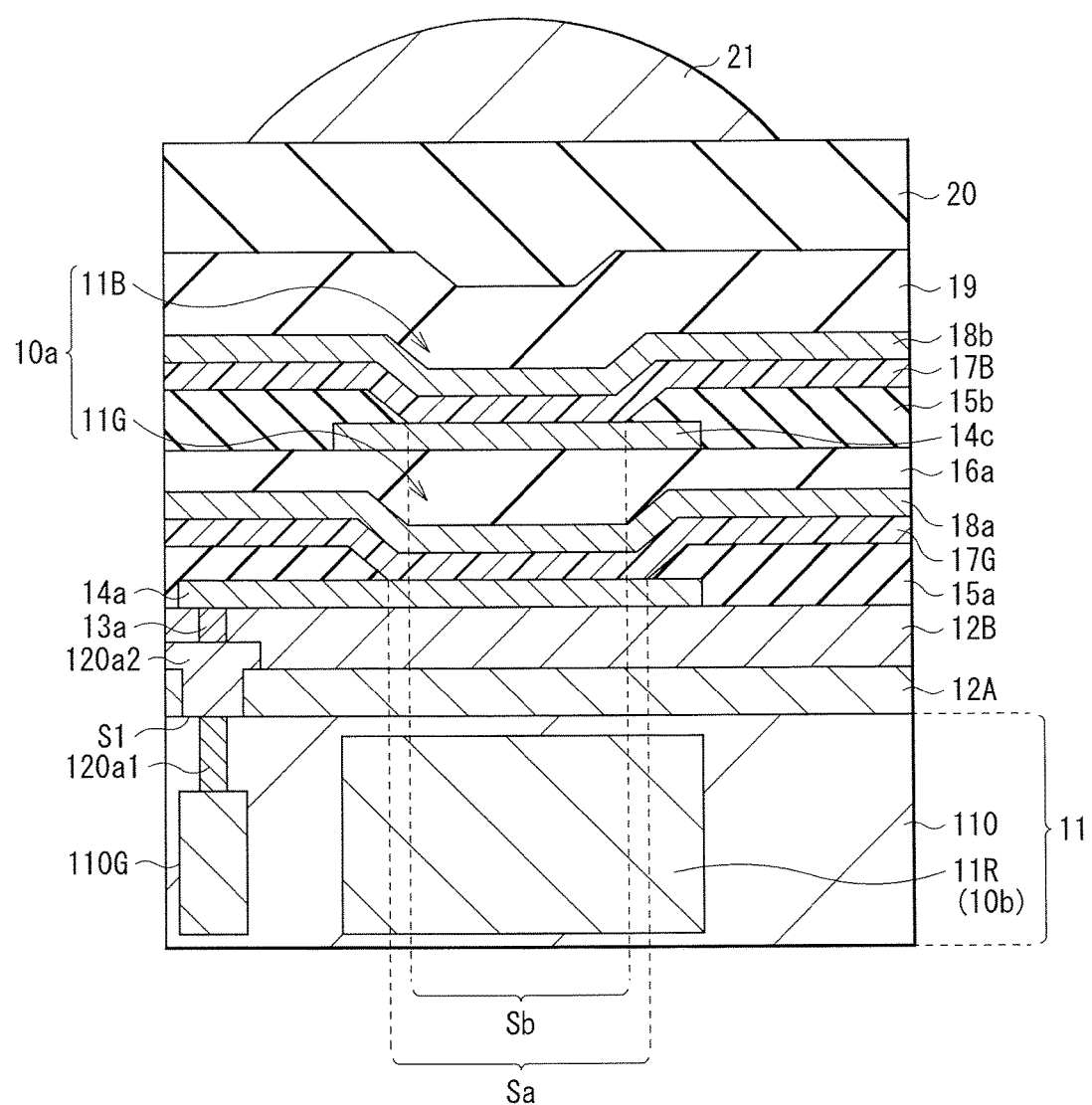
FIG. 19 is a sectional diagram illustrating a structure of a main part of a photoelectric conversion element (a pixel) according to a third embodiment of the disclosure.

FIG. 19 illustrates a structure of a main part of a photoelectric conversion element according to the third embodiment. In the above-described first embodiment, one organic photoelectric conversion layer 17G is provided in the organic photoelectric conversion section 10a, and two inorganic photoelectric conversion layers 11B and 11R are provided in the inorganic photoelectric conversion section 10b; however, the combination of the number of the photoelectric conversion layers stacked in each of the photoelectric conversion sections is not limited thereto. Specifically, the organic photoelectric conversion section 10a may be provided with two organic photoelectric conversion layers and the inorganic photoelectric conversion section 10b may be provided with one inorganic photoelectric conversion layer. For example, the organic photoelectric conversion section 11B performing the photoelectric conversion of the blue light and the organic photoelectric conversion section 11G performing the photoelectric conversion of the green light are provided in the organic photoelectric conversion section 10a, and the inorganic photoelectric conversion layer 11R performing the photoelectric conversion of the red light is provided in the inorganic photoelectric conversion section 10b.

In the organic photoelectric conversion section 10a, the organic photoelectric conversion section 11G and the organic photoelectric conversion section 11B are formed in order from the semiconductor substrate 11 side. The organic photoelectric conversion section 11B is provided on the organic photoelectric conversion section 11G with an inter-layer insulating film 16a in between, and similarly to the case of the organic photoelectric conversion section 11G described above, the organic photoelectric conversion section 11B has an inter-pixel insulating film 15b on the lower electrode 14c. The inter-pixel insulating film 15b has an opening section H2 that faces the lower electrode 14c, and an organic photoelectric conversion layer 17B is formed from an inside of the opening section H2 (the upper surface of the lower electrode 14c) over the peripheral region thereof. An upper electrode 18b is so provided as to cover the organic photoelectric conversion layer 17B, and the protection film 19 and the planarization layer 20 are stacked in this order on the upper electrode 18b. Incidentally, also in the organic photoelectric conversion section 11B, the lower electrode 14c is separated for each pixel, and the signal charges (the signal charges corresponding to the blue light) are extracted from the lower electrode 14c through a not-illustrated wiring layer. In addition, the upper electrode 18b is provided common to the respective pixels.

In this case, in the organic photoelectric conversion section 10a, the light incident angle-sensitivity characteristics of each of the organic photoelectric conversion sections 11B and 11G are equivalent to the light incident angle-sensitivity characteristics of the inorganic photoelectric conversion section 10b as illustrated in FIG. 6B. Specifically, an opening area Sb of the opening section H1 of the inter-pixel insulating film 15a of the organic photoelectric conversion section 11B and an opening area Sa of the opening section H2 of the inter-pixel insulating film 15b of the organic photoelectric conversion section 11G are each adjusted. At this time, the opening area Sb of the opening section H2 on a side closer to the light incident side (on a side closer to the on-chip lens 21) is so set as to be smaller than the opening area Sa of the opening section H1.

Also in such a case, similarly to the above-described first embodiment, since the light incident angle-sensitivity characteristics of the organic photoelectric conversion section 10a are equivalent to the light incident angle-sensitivity characteristics of the inorganic photoelectric conversion section 10b, for each pixel, it is possible to suppress variation in the ratio of the pixel outputs in respective colors. Accordingly, it is possible to obtain effects equivalent to those in the above-described first embodiment.

Moreover, also in the present embodiment, the color combination in each of the photoelectric conversion sections is not limited, and the photoelectric conversion of the green light and the red light (or the blue light and the green light) may be performed in the organic photoelectric conversion section 10a, and the photoelectric conversion of the blue light (or the red light) may be performed in the inorganic photoelectric conversion section 10b. Incidentally, as described above, it is desirable that the photoelectric conversion layer with shorter wavelength be formed on a side closer to the light incident side in each of the organic photoelectric conversion section 10a and the inorganic photoelectric conversion section 10b (for each photoelectric conversion section).

Fourth Embodiment

Figure 20:
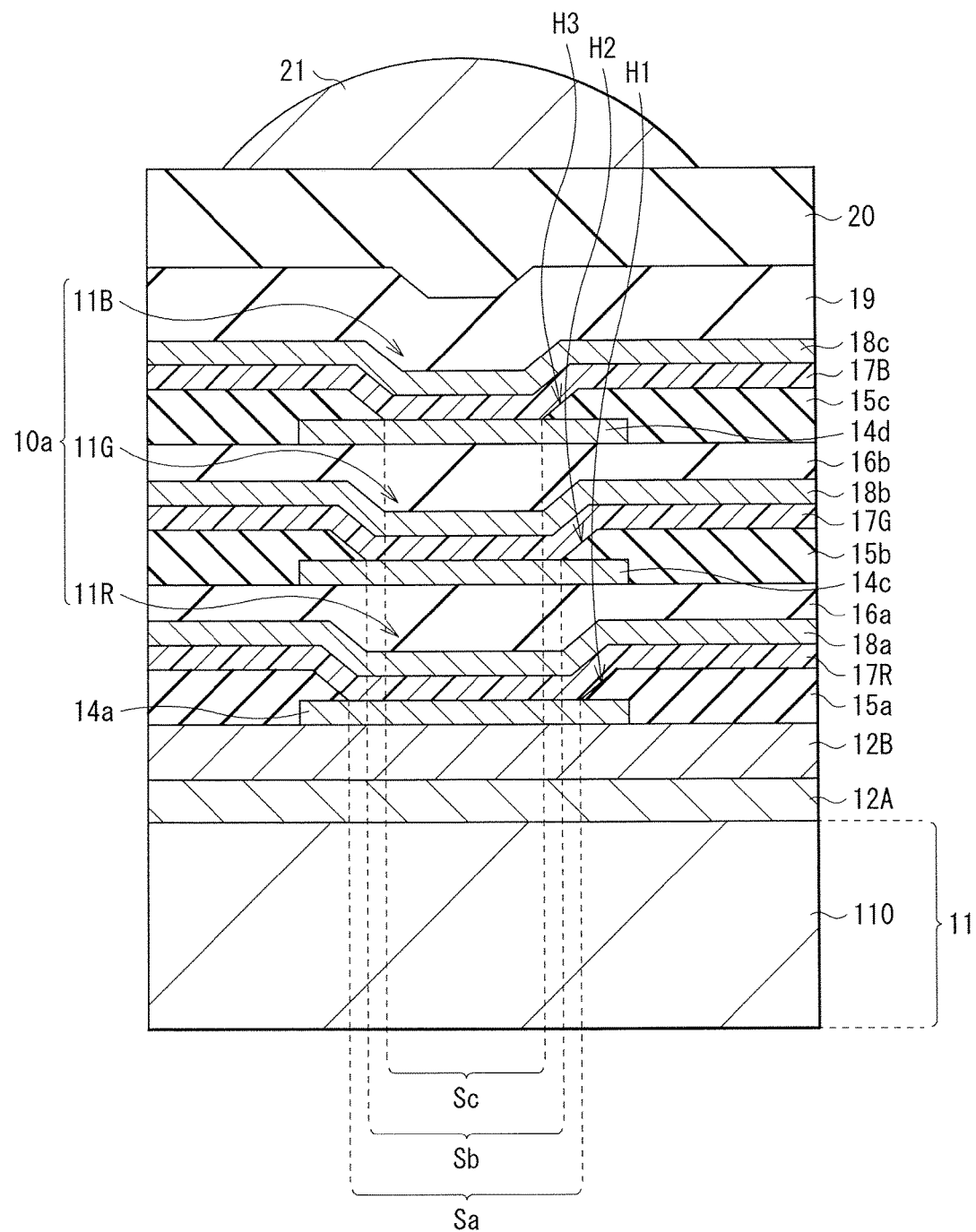
FIG. 20 is a sectional diagram illustrating a structure of a main part of a photoelectric conversion element (a pixel) according to a fourth embodiment of the disclosure.

FIG. 20 illustrates a structure of a main part of a photoelectric conversion element according to the fourth embodiment. In the above-described first and second embodiments, the case where the organic photoelectric conversion section 10a is formed on the semiconductor substrate 11 and the inorganic photoelectric conversion section 10b is formed in the semiconductor substrate 11 has been described; however, a structure configured of only the organic photoelectric conversion section 10a may be employed. Incidentally, in this case, the organic photoelectric conversion section 10a may be configured of two or more organic photoelectric conversion sections, for example, organic photoelectric conversion sections 11R, 11G, and 11B that photoelectrically convert light of three colors of R, G, and B, respectively.

In the organic photoelectric conversion section 10a, the organic photoelectric conversion sections 11R, 11G, and 11B are formed in order from the semiconductor substrate 11 side. Similarly to the organic photoelectric conversion section 11G according to the above-described first embodiment, the organic photoelectric conversion section 11R is provided on the interlayer insulating film 12B, and has the inter-pixel insulating film 15a on the lower electrode 14a. The inter-pixel insulating film 15a has the opening section H1 facing the lower electrode 14c, and an organic photoelectric conversion layer 17R is formed from the inside of the opening section H1 over the peripheral region thereof. The upper electrode 18a is so provided as to cover the organic photoelectric conversion layer 17R. The organic photoelectric conversion section 11B is provided on the organic photoelectric conversion section 11R with the interlayer insulating film 16a in between, and has the inter-pixel insulating film 15b on the lower electrode 14c. The inter-pixel insulating film 15b has the opening section H2 facing the lower electrode 14c, and the organic photoelectric conversion layer 17B is formed from the inside of the opening section H2 over the peripheral region thereof. The upper electrode 18b is so provided as to cover the organic photoelectric conversion layer 17B. The organic photoelectric conversion section 11G is provided on the organic photoelectric conversion section 11B with an interlayer insulating film 16b in between, and has an inter-pixel insulating film 15c on a lower electrode 14d. The inter-pixel insulating film 15c has an opening section H3 facing the lower electrode 14d, and an organic photoelectric conversion layer 17G is formed from the inside of the opening section H3 over the peripheral region thereof. An upper electrode 18c is so provided as to cover the organic photoelectric conversion layer 17G. The protection film 19 and the planarization layer 20 are stacked in this order on the upper electrode 18c. Note that, in any of the organic photoelectric conversion sections 11R, 11G, and 11B, the lower electrode (the lower electrodes 14a, 14b, and 14c) is separated for each pixel, and the signal charges are extracted from each lower electrode through a not-illustrated wiring layer. In addition, the upper electrode (the upper electrodes 18a, 18b, and 18c) is provided common to the respective pixels.

In this case, in the organic photoelectric conversion section 10a, the light incident angle-sensitivity characteristics of the organic photoelectric conversion sections 11R, 11G, and 11B are equivalent to one another. Specifically, an opening area Sc of the opening section H3 of the organic photoelectric conversion section 11G, the opening area Sb of the opening section H2 of the organic photoelectric conversion section 11B, and the opening area Sa of the opening section H1 of the organic photoelectric conversion section 11R are each adjusted. At this time, the adjustment is performed such that the opening area of the opening section on a side closer to the light incident side (on a side closer to the on-chip lens 21) becomes smaller (Sc<Sb<Sa).

Also in such a case, similarly to the above-described first embodiment, the light incident angle-sensitivity characteristics of each photoelectric conversion section in the organic photoelectric conversion section 10a are equivalent to each other for each pixel. Therefore, it is possible to suppress the variation in the ratio of the pixel outputs in respective colors. Accordingly, it is possible to obtain effects equivalent to those in the above-described first embodiment.

Incidentally, in the present embodiment, the stacking order of the photoelectric conversion sections of R, G, and B is not limited to that described above, and other stacking order may be employed. However, as described above, the photoelectric conversion layer with shorter wavelength may be desirably formed on a side closer to the light incident side.

Fifth Embodiment

Figure 21A:
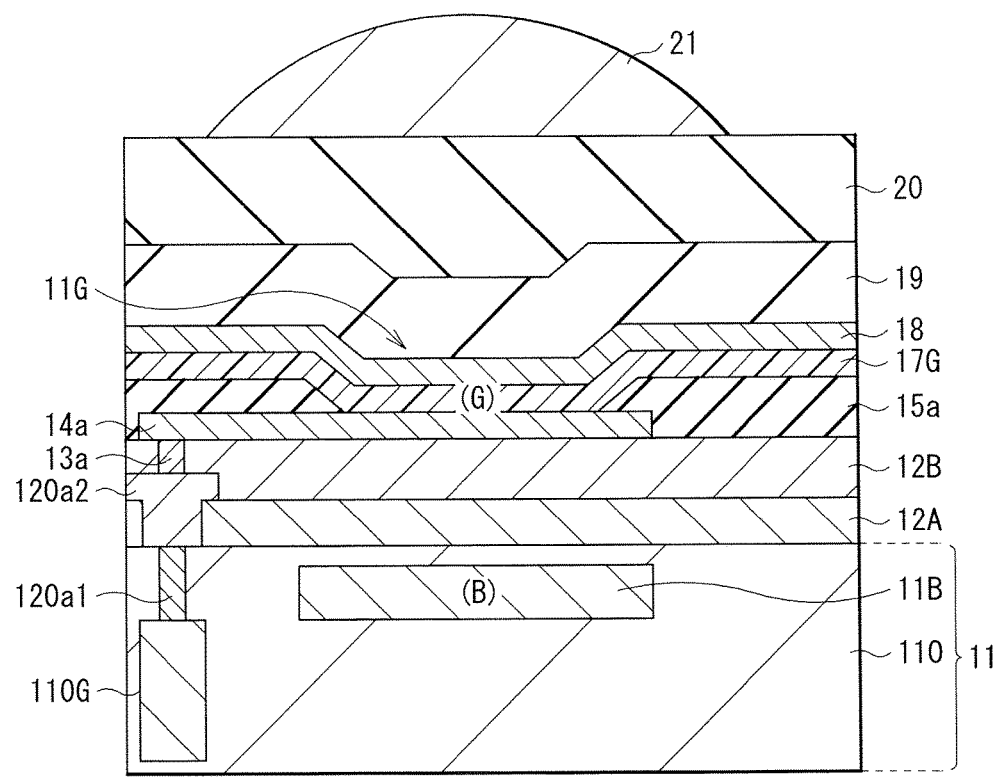
FIG. 21A is a sectional diagram illustrating a structure of a main part of a photoelectric conversion element (a pixel) according to a fifth embodiment of the disclosure.
Figure 21B:
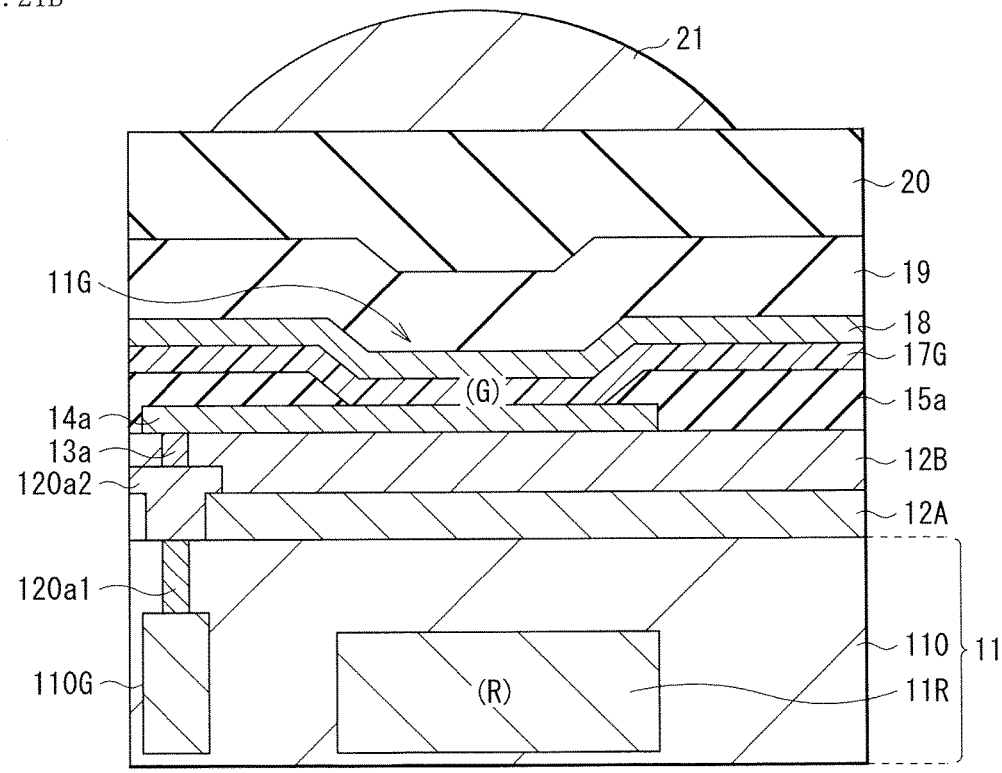
FIG. 21B is a sectional diagram illustrating the structure of the main part of the photoelectric conversion element (the pixel) according to the fifth embodiment of the disclosure.

FIG. 21A and FIG. 21B each illustrate a structure of a main part of a photoelectric conversion element according to the fifth embodiment. In the above-described first embodiment, the case where three photoelectric conversion layers performing photoelectric conversion of each color of R, G, and B are stacked in one pixel has been described; however, these three layers are not necessarily arranged in the same pixel. For example, a pixel A (FIG. 21A) that includes the organic photoelectric conversion section 11G as the organic photoelectric conversion section 10a and the inorganic photoelectric conversion layer 11B as the inorganic photoelectric conversion section 10b and a pixel B (FIG. 21B) that includes the organic photoelectric conversion section 11G as the organic photoelectric conversion section 10a and the inorganic photoelectric conversion layer 11R as the inorganic photoelectric conversion section 10b may be two-dimensionally arranged. In the pixel A, the inorganic photoelectric conversion layer 11B is formed in a relatively shallow region in the semiconductor substrate 11, whereas in the pixel B, the inorganic photoelectric conversion layer 11R is formed in a relatively deep region in the semiconductor substrate 11. The two-dimensional arrangement of the pixels A and B is a hound's tooth shape, for example, as illustrated in FIG. 22.

Sixth Embodiment

Figure 23A:
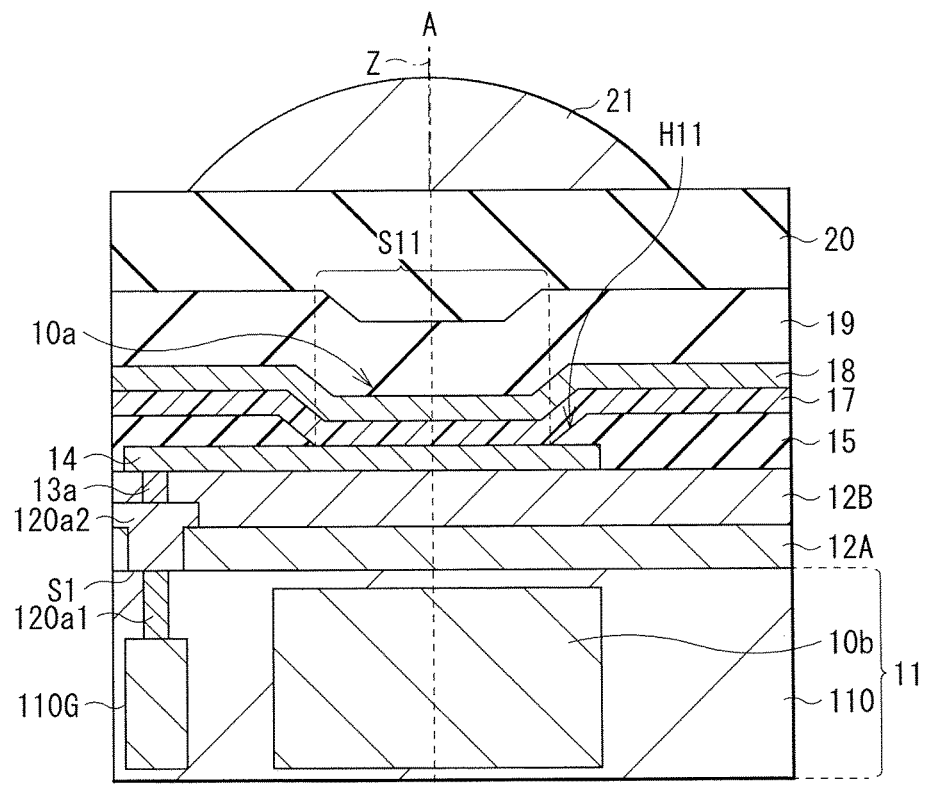
FIG. 23A is a sectional diagram illustrating a structure of a main part of a photoelectric conversion element (a pixel) according to a sixth embodiment of the disclosure.
Figure 23B:
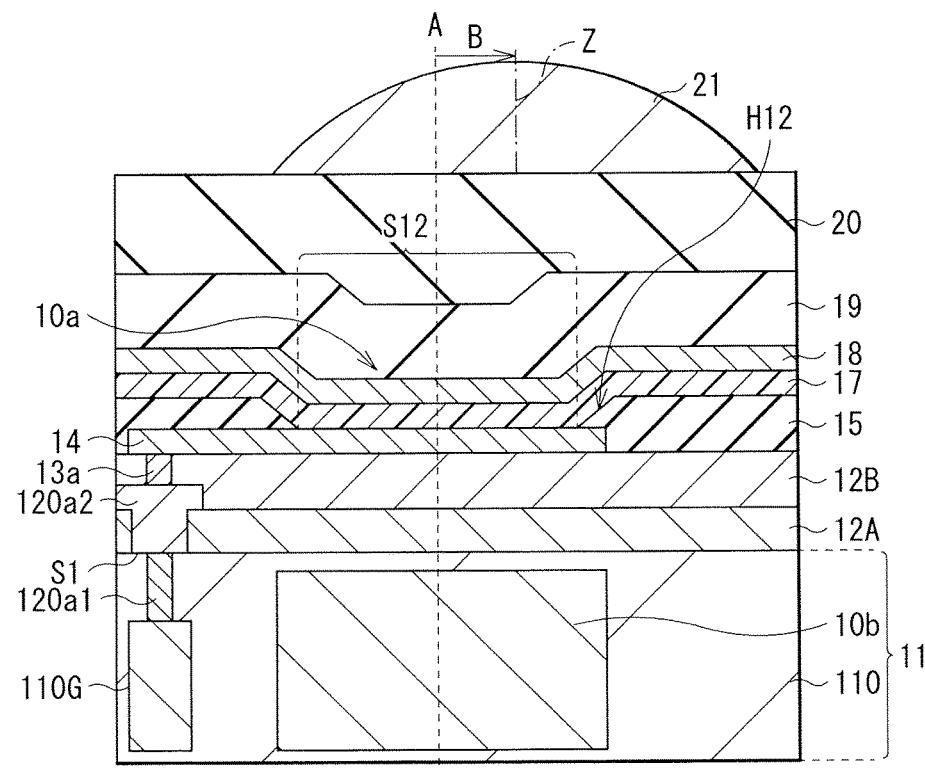
FIG. 23B is a sectional diagram illustrating a structure of the main part of the photoelectric conversion element (the pixel) according to the sixth embodiment of the disclosure.
Figure 24A:
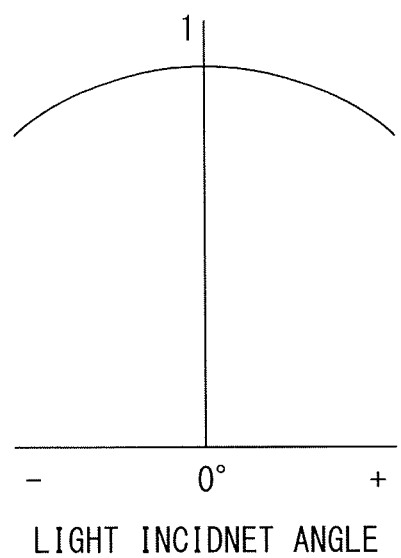
FIG. 24A is a characteristic diagram for explaining light incident angle dependency of sensitivity of the pixel illustrated in FIG. 23A.
Figure 24B:
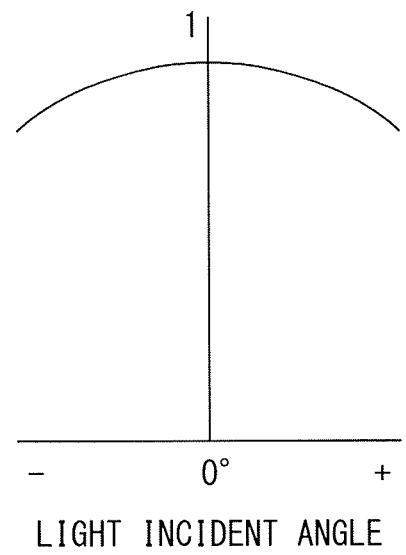
FIG. 24B is a characteristic diagram for explaining light incident angle dependency of sensitivity of the pixel illustrated in FIG. 23A.

FIG. 23A and FIG. 23B each illustrate a structure of a main part of a photoelectric conversion element according to the sixth embodiment. FIG. 23A corresponds to a pixel arranged at a center part of a pixel region (a pixel region 1a described later, chip), and FIG. 23B corresponds to a pixel arranged at an end part (a region far away from the center part) of the pixel region, in the solid-state image pickup device described later. Also in the present embodiment, similarly to the above-described first embodiment, the light incident angle-sensitivity characteristics of the organic photoelectric conversion section 10a is so set as to be equivalent to the light incident angle-sensitivity characteristics of the inorganic photoelectric conversion section 10b for each pixel. Incidentally, in the solid-state image pickup device in which a plurality of pixels are two-dimensionally arranged, the light incident angle is varied depending on the pixel position. Therefore, in the present embodiment, the on-chip lens 21 is shirted and arranged (is subjected to so-called pupil correction) depending on the pixel position. Specifically, the pixels at the center part are arranged such that an optical axis Z of the on-chip lens 21 is coincident with a pixel center axis A, and the pixels at the end part are arranged at positions where the optical axis Z of the on-chip lens 21 is shifted from the pixel center axis A by a predetermined distance B. In other words, in the pixels at the end part, the lens position is offset such that the sensitivity becomes the maximum at a certain light incident angle (an incident angle ω). Incidentally, although illustration is omitted, the shift amount of the on-chip lens 21 in each pixel is gradually varied from the center part toward the end part (is set according to the distance from the center part).

Figure 25A:
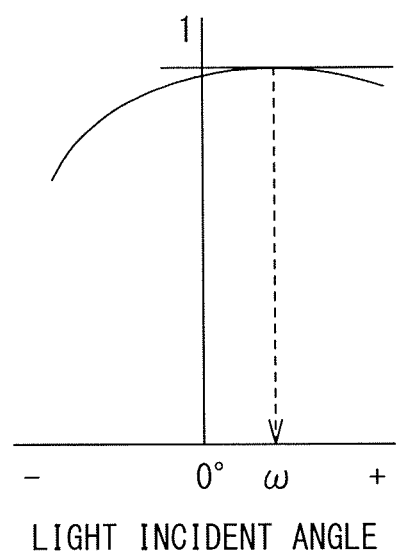
FIG. 25A is a characteristic diagram for explaining light incident angle dependency of sensitivity of the pixel illustrated in FIG. 23B.
Figure 25B:
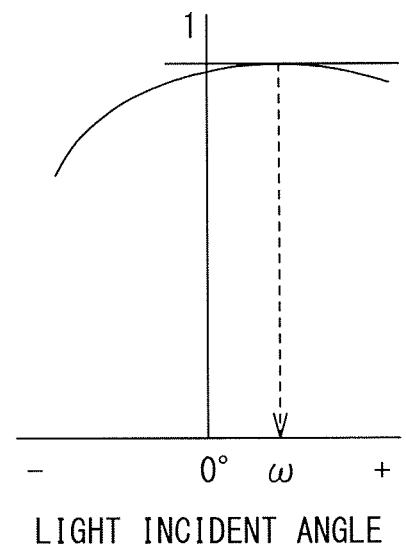
FIG. 25B is a characteristic diagram for explaining light incident angle dependency of sensitivity of the pixel illustrated in FIG. 23B.

Here, the light incident angle-sensitivity characteristics of the organic photoelectric conversion section 10a in the pixel at the center part (FIG. 23A) are illustrated in FIG. 23A, and the light incident angle-sensitivity characteristics of the inorganic photoelectric conversion section 10b in the same pixel are illustrated in FIG. 23AB. Moreover, the light incident angle-sensitivity characteristics of the organic photoelectric conversion section 10a in the pixel at the end part (FIG. 23B) are illustrated in FIG. 25A, and the light incident angle-sensitivity characteristics of the inorganic photoelectric conversion section 10b in the same pixel are illustrated in FIG. 25B. Incidentally, the sensitivity in the case where the light incident angle is 0 degrees is normalized as 1 in FIG. 23A, (B), and the sensitivity in the case where the light incident angle is ω is normalized as 1 in FIG. 25A, (B).

As described above, when the pupil correction is performed in the on-chip lens 21, for example, the area of an opening (opening sections H11 and H12) may be desirably set in the following manner. Specifically, when $E_0$ indicates illuminance on an optical axis (illuminance at the light incident angle of 0 degrees), illuminance E of light incident at the light incident angle θ is represented by the following expression (1). In this way, the illuminance E of the light is lowered as the light incident angle θ is increased.

$$E = E_0 \cos^4 \theta \tag{1}$$

Therefore, the area ratio of the area S11 of the opening section H11 to the area S12 of the opening section H12 may desirably satisfy the following expression (2) so that the sensitivity in the pixel at the center part (the light incident angle is 0 degrees, and the lens offset is absent) and the sensitivity in the pixel at the end part (the light incident angle is ω, and the lens offset is presence) are equivalent to each other.

$$S11:S12 = \cos^4 \omega : 1 \tag{2}$$

Incidentally, when the pupil correction is performed, the opening area may be desirably set for each pixel (depending on the pixel position) as described above; however, the opening areas of the respective pixels may be different from one another or may be equal to one another as long as the light incident angle-sensitivity characteristics of the organic photoelectric conversion section 10a and that of the inorganic photoelectric conversion section 10b are so designed as to be equivalent to each other for each pixel. In addition, the sensitivity of the organic photoelectric conversion section 10a in each pixel is not limited to the case where the sensitivity is controlled by the opening area (the bonding area of the organic photoelectric conversion layer 17 with the lower electrode 14), and may be controlled by the area of the upper electrode 18a in the pixel structure described in the above-described second embodiment. Moreover, the sensitivity control including the pupil correction in the present embodiment is applicable to the stacked layer structure described in each of the above-described third to fifth embodiments.

<Overall Configuration of Solid-State Image Pickup Device>

Figure 26:
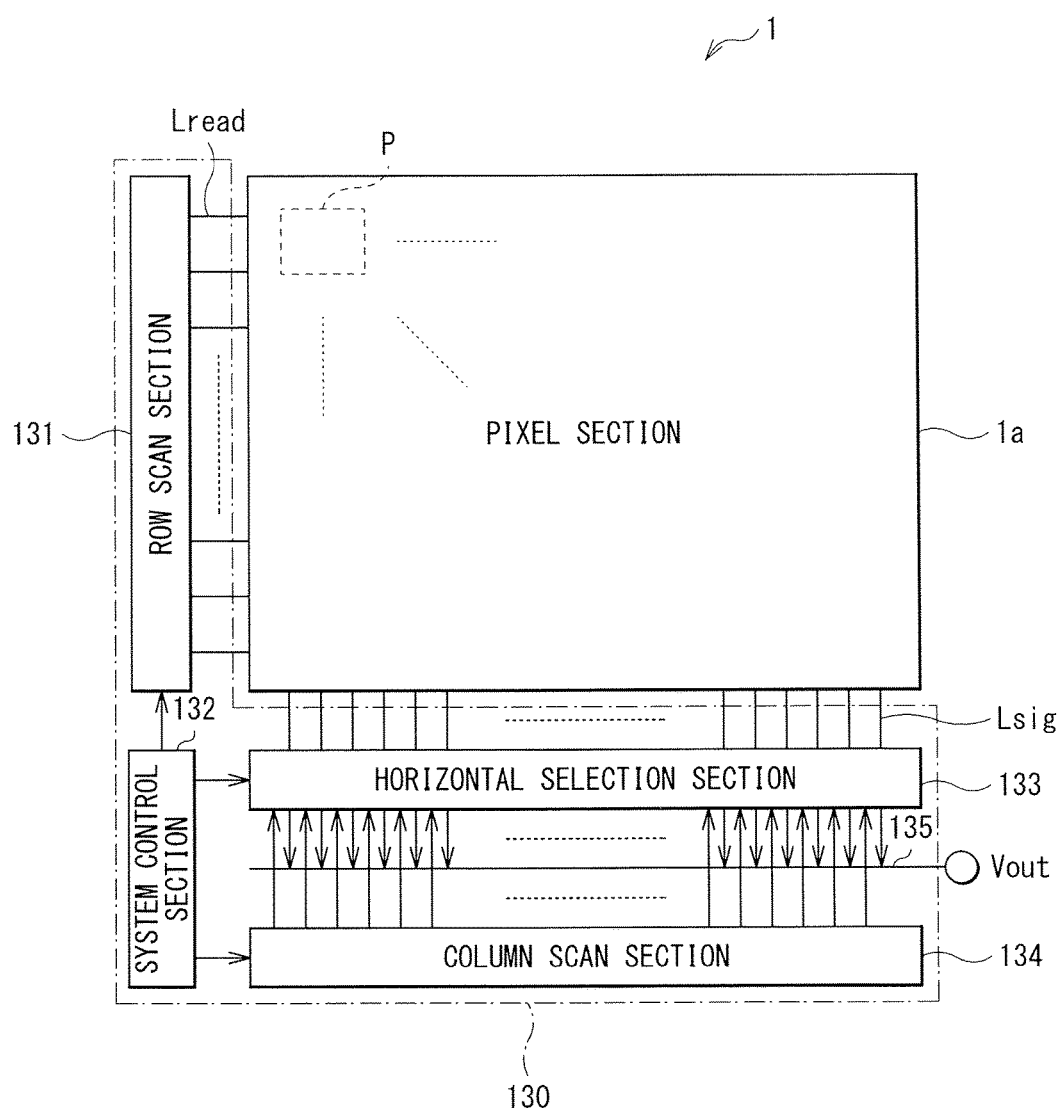
FIG. 26 is a functional block diagram of a solid-state image pickup device.

FIG. 26 is a functional block diagram of a solid-state image pickup device (a solid-state image pickup device 1) in which the photoelectric conversion element described in the above-described embodiment is used in each pixel. The solid-state image pickup device 1 is a CMOS image sensor, and has a pixel section 1a as an image pickup region and a circuit section 130 that may be configured of, for example, a row scan section 131, a horizontal selection section 133, a column scan section 134, and a system control section 132. The circuit section 130 may be provided in a peripheral region of the pixel section 1a while being stacked on the peripheral region of the pixel section 1a or the pixel section 1a, or may be provided while being stacked on the pixel section 1a (in a region facing the pixel section 1a).

For example, the pixel section 1a has a plurality of unit pixels P (each corresponding to the photoelectric conversion element 10) that may be two-dimensionally arranged in a matrix. For example, a pixel drive line Lread (specifically, a row selection line and a reset control line) may be wired for each pixel row of the unit pixels P, and a vertical signal line Lsig may be wired for each pixel column of the unit pixels P. The pixel drive line Lread transmits a drive signal for signal read out from the pixel. One end of the pixel drive line Lread is connected to an output end of the row scan section 131 corresponding to each row.

The row scan section 131 is a pixel drive section that is configured of a shift resistor, an address decoder, or the like and may drive the pixels P of the pixel section 1a on a row basis, for example. A signal output from each pixel P in the pixel row that is selected and scanned by the row scan section 131 is supplied to the horizontal selection section 133 through each of the vertical signal lines Lsig. The horizontal selection section 133 is configured of an amplifier, a horizontal selection switch, or the like, that is provided for each vertical signal line Lsig.

The column scan section 134 is configured of a shift resistor, an address decoder, or the like, and sequentially drives each of the horizontal selection switches in the horizontal selection section 133 while performing scanning thereof. By the selection scanning by the column scan section 134, the signal of each pixel transmitted through each of the vertical signal lines Lsig is sequentially transmitted to the horizontal signal line 135, and is output to the outside through the corresponding horizontal signal line 135.

The system control section 132 receives a clock provided from the outside, data instructing an operation mode, and the like, and outputs data such as internal information of the solid-state image pickup device 1. The system control section 132 further includes a timing generator that generates various kinds of timing signals, and performs drive control of the row scan section 131, the horizontal selection section 133, the column scan section 134, etc., based on the various kinds of timing signals generated by the timing generator.

Application Example

Figure 27:
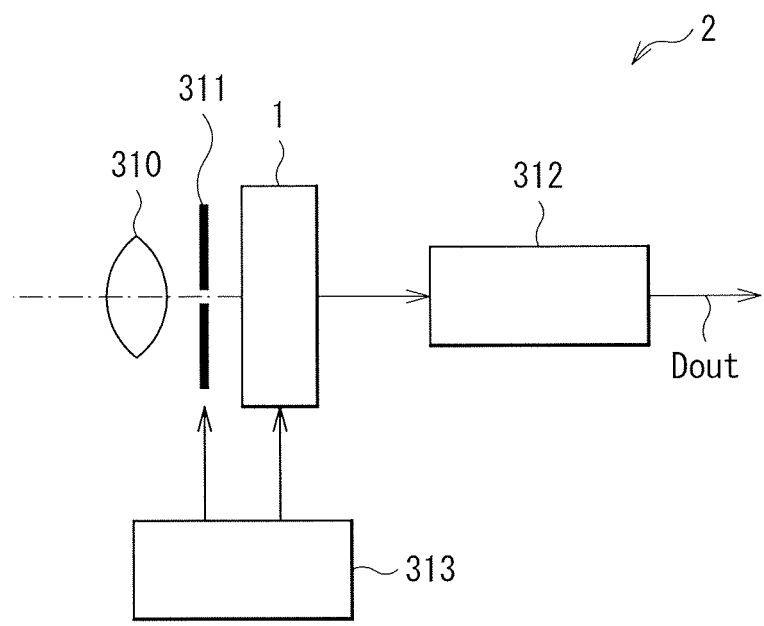
FIG. 27 is a functional block diagram of an electronic apparatus according to an application example.

The above-described solid-state image pickup device 1 is applicable to all types of electro c apparatuses having an image pickup function, for example, a camera system such as a digital still camera and a video camera, a mobile phone having an linage pickup function, and the like. FIG. 27 illustrates a schematic configuration of an electronic apparatus 2 (a camera) as an example. For example, the electronic apparatus 2 may be a video camera capable of shooting a still image or a moving picture, and includes the solid-state image pickup device 1, an optical system (an optical lens) 310, a shutter device 311, a drive section 313 that drives the solid-state image pickup device 1 and the shutter device 311, and a signal processing section 312.

The optical system 310 guides image light (incident light) from an object to the pixel section 1a of the solid-state image pickup device 1, The optical system 310 may be configured of a plurality of optical lenses. The shutter device 311 controls a light irradiation period and a light shielding period to the solid-state image pickup device 1. The drive section 313 controls transfer operation of the solid-state image pickup device 1 and shutter operation of the shutter device 311. The signal processing section 312 performs various kinds of signal processing on the signals output from the solid-state image pickup device 1. A signal-processed picture signal Dout is stored in a storage medium such as a memory or is output to a monitor or the like.

Hereinbefore, although the present disclosure has been described with referring to the embodiments and the application example, the contents of the disclosure are not limited to the above-described embodiments and the like, and various modifications may be made. For example, in the above-described embodiments and the like, the case where the inter-pixel insulating film is provided on the lower electrode and the lower electrode and the organic photoelectric conversion layer are bonded in the opening section in the organic photoelectric conversion section has been exemplified; however, the inter-pixel insulating film is not necessarily provided. In this case, it is sufficient that the above-described light incident angle-sensitivity characteristics are set according to the area of the surface of the lower electrode on the organic photoelectric conversion layer side.

Moreover, in the above-described embodiments and the like, the backside illumination type solid-state image pickup device has been described as an example; however, the contents of the present disclosure are applicable to a frontside illumination type solid-state image pickup device.

Moreover, the photoelectric conversion element of the present disclosure is not necessarily provided with all of the components described in the above-described embodiments and the like, and in contrast, may be provided with other layers.

Note that the present disclosure may be configured as follows.

(1) A solid-state image pickup device including
a plurality of pixels each having at least two stacked first and second photoelectric conversion sections, wherein
change rates of sensitivity of the respective first and second photoelectric conversion sections to a light incident angle are equal to each other for each of the pixels.

(2) The solid-state image pickup device according to (1), wherein at least the first photoelectric conversion section of the first and second photoelectric conversion sections is provided on a semiconductor substrate.

(3) The solid-state image pickup device according to (2), wherein the first photoelectric conversion section includes an organic photoelectric conversion layer.

(4) The solid-state image pickup device according to (2), wherein the first photoelectric conversion section includes a first electrode, an organic photoelectric conversion layer, and a second electrode in order on the semiconductor substrate, and
the first electrode is separated for each of the pixels.

(5) The solid-state image pickup device according to (4), wherein the sensitivity of the first photoelectric conversion section is set based on a bonding area between the first electrode and the organic photoelectric conversion layer.

(6) The solid-state image pickup device according to (5), further including
an insulating film provided between the first electrode and the organic photoelectric conversion layer, and having an opening section that faces the first electrode, wherein
the sensitivity of the first photoelectric conversion section is set based on an opening area of the opening section.

(7) The solid-state image pickup device according to (5), wherein the sensitivity of the first photoelectric conversion section is set based on an area of a surface of the first electrode on the organic photoelectric conversion layer side.

(8) The solid-state image pickup device according to (2), wherein
the first photoelectric conversion section includes a first electrode, an organic photoelectric conversion layer, and a second electrode in order on the semiconductor substrate, and
the second electrode is separated for each of the pixels.

(9) The solid-state image pickup device according to (8), wherein the sensitivity of the first photoelectric conversion section is set based on a bonding area between the second electrode and the organic photoelectric conversion layer.

(10) The solid-state image pickup device according to (2), wherein
the first photoelectric conversion section includes an organic photoelectric conversion layer, and
the second photoelectric conversion section is provided in the semiconductor substrate and has an inorganic photoelectric conversion layer.

(11) The solid-state image pickup device according to (10), wherein the organic photoelectric conversion layer and the inorganic photoelectric conversion layer include a photoelectric conversion layer of each of red light, green light, and blue light as a whole.

(12) The solid-state image pickup device according to (11), wherein
the organic photoelectric conversion layer performs photoelectric conversion of the green light in the first photoelectric conversion section, and
the second photoelectric conversion section includes a photoelectric conversion layer performing photoelectric conversion of the blue light and a photoelectric conversion layer performing photoelectric conversion of the red light, as the inorganic photoelectric conversion layer.

(13) The solid-state image pickup device according to (11), wherein
the first photoelectric conversion section includes a photoelectric conversion layer performing photoelectric conversion of the blue light and a photoelectric conversion layer performing photoelectric conversion of the green light, as the organic photoelectric conversion layer, and
the inorganic photoelectric conversion layer performs photoelectric conversion of the red light in the second photoelectric conversion section.

(14) The solid-state image pickup device according to (11), wherein
each of the first and second photoelectric conversion sections is provided with a photoelectric conversion layer with shorter wavelength on a light incident side.

(15) The solid-state image pickup device according to (2), wherein
both of the first and second photoelectric conversion sections are provided on the semiconductor substrate and include one or two or more organic photoelectric conversion layers.

(16) The solid-state image pickup device according to (15), wherein the first and second photoelectric conversion sections include an organic photoelectric conversion layer of each of red light, green right, and blue light as a whole.

(17) The solid-state image pickup device according to (16), wherein
a red organic photoelectric conversion layer, a green organic photoelectric conversion layer, and a blue organic photoelectric conversion layer are provided in order from the semiconductor substrate side.

(18) The solid-state image pickup device according to any one of (1) to (17), wherein
the plurality of pixels are two-dimensionally arranged,
each of the pixels is provided with a micro-lens on a side closer to a light incident side than the first and second photoelectric conversion sections, and
the micro-lens is arranged to have an optical axis shifted from a pixel center, based on a pixel position in the two-dimensional arrangement.

(19) The solid-state image pickup device according to (18), wherein at least the first photoelectric conversion section of the first and second photoelectric conversion sections is provided on the semiconductor substrate, and
the sensitivity of the first photoelectric conversion section is set based on the pixel position.

(20) An electronic apparatus provided with a solid-state image pickup device, the solid-state image pickup device including
a plurality of pixels each having at least two stacked first and second photoelectric conversion sections, wherein
change rates of sensitivity of the respective first and second photoelectric conversion sections to a light incident angle are equal to each other for each of the pixels.

This application is based upon and claims the benefit of priority of the Japanese Patent Application No. 2012-179688 filed in the Japan Patent Office on Aug. 14, 2012, the entire contents of this application are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A solid-state image pickup device, comprising:
a plurality of pixels, wherein each of the plurality of pixels comprises a first photoelectric conversion section and a second photoelectric conversion section,
wherein at least the first photoelectric conversion section is provided on a semiconductor substrate,
wherein a rate of change of sensitivity with respect to a light incident angle for the first photoelectric conversion section is based on a bonding area between a first electrode and an organic photoelectric conversion layer of the first photoelectric conversion section, and
wherein the rate of change of sensitivity with respect to the light incident angle is same for the first photoelectric conversion section and the second photoelectric conversion section in each of the plurality of pixels.

2. The solid-state image pickup device according to claim 1, wherein
the first photoelectric conversion section includes the first electrode, the organic photoelectric conversion layer, and a second electrode in order on the semiconductor substrate, and
the first electrode is separated for each of the plurality of pixels.

3. The solid-state image pickup device according to claim 2, further comprising
an insulating film provided between the first electrode and the organic photoelectric conversion layer,
wherein the insulating film has an opening section that faces the first electrode, and
wherein the sensitivity of the first photoelectric conversion section is set based on an opening area of the opening section.

4. The solid-state image pickup device according to claim 2, wherein the sensitivity of the first photoelectric conversion section is set based on an area of a surface of the first electrode on the organic photoelectric conversion layer side.

5. The solid-state image pickup device according to claim 1, wherein the first photoelectric conversion section includes a second electrode, the organic photoelectric conversion layer, and the first electrode in order on the semiconductor substrate, and the first electrode is separated for each of the plurality of pixels.

6. The solid-state image pickup device according to claim 1, wherein the second photoelectric conversion section is provided on the semiconductor substrate and has an inorganic photoelectric conversion layer.

7. The solid-state image pickup device according to claim 6, wherein the organic photoelectric conversion layer and the inorganic photoelectric conversion layer include a red photoelectric conversion layer, a green photoelectric conversion layer, and a blue photoelectric conversion layer as a whole.

8. The solid-state image pickup device according to claim 7, wherein the organic photoelectric conversion layer is configured for photoelectric conversion of the green light in the first photoelectric conversion section, and the second photoelectric conversion section includes the blue photoelectric conversion layer configured for photoelectric conversion of the blue light and the red photoelectric conversion layer configured for photoelectric conversion of the red light, as the inorganic photoelectric conversion layer.

9. The solid-state image pickup device according to claim 7, wherein the first photoelectric conversion section includes the blue photoelectric conversion layer configured for photoelectric conversion of the blue light and the green photoelectric conversion layer configured for photoelectric conversion of the green light, as the organic photoelectric conversion layer, and the inorganic photoelectric conversion layer is configured for photoelectric conversion of the red light in the second photoelectric conversion section.

10. The solid-state image pickup device according to claim 7, wherein each of the first and second photoelectric conversion sections is provided with a photoelectric conversion layer with shorter wavelength on a light incident side.

11. The solid-state image pickup device according to claim 1, wherein both of the first and second photoelectric conversion sections are provided on the semiconductor substrate and include one or more organic photoelectric conversion layers.

12. The solid-state image pickup device according to claim 11, wherein the first and second photoelectric conversion sections include a red organic photoelectric conversion layer, a green organic photoelectric conversion layer, and a blue organic photoelectric conversion layer as a whole.

13. The solid-state image pickup device according to claim 12, wherein the red organic photoelectric conversion layer, the green organic photoelectric conversion layer, and the blue organic photoelectric conversion layer are provided in order from the semiconductor substrate side.

14. The solid-state image pickup device according to claim 1, wherein the plurality of pixels are two-dimensionally arranged, each of the plurality of pixels is provided with a micro-lens on a side closer to a light incident side than the first and second photoelectric conversion sections, and the micro-lens is arranged to have an optical axis shifted from a pixel center, based on a pixel position in the two-dimensional arrangement.

15. The solid-state image pickup device according to claim 14, wherein the sensitivity of the first photoelectric conversion section is set based on the pixel position.

16. An electronic apparatus provided with a solid-state image pickup device, the solid-state image pickup device comprising:

a plurality of pixels, wherein each of the plurality of pixels comprises at least a first photoelectric conversion section and a second photoelectric conversion section, wherein the at least first photoelectric conversion section and second photoelectric conversion section are stacked, wherein at least the first photoelectric conversion section is provided on a semiconductor substrate, wherein a rate of change of sensitivity with respect to a light incident angle for the first photoelectric conversion section is based on a bonding area between a first electrode and an organic photoelectric conversion layer of the first photoelectric conversion section, wherein the rate of change of sensitivity with respect to the light incident angle is same for the first photoelectric conversion section and the second photoelectric conversion section in each of the plurality of pixels.

* * * * *